(12) United States Patent
Hirasawa et al.

(10) Patent No.: US 8,870,509 B2
(45) Date of Patent: Oct. 28, 2014

(54) ATTACHMENT STRUCTURE AND DISPLAY APPARATUS

(71) Applicant: Sony Corporation, Tokyo (JP)

(72) Inventors: Takeaki Hirasawa, Tokyo (JP); Takuya Toriumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/013,408

(22) Filed: Aug. 29, 2013

(65) Prior Publication Data

US 2014/0093330 A1    Apr. 3, 2014

(30) Foreign Application Priority Data

Oct. 1, 2012   (JP) ................ 2012-219509

(51) Int. Cl.
*F16B 37/00*   (2006.01)
*F16M 11/00*   (2006.01)
*G09F 9/00*    (2006.01)
*H04N 5/64*    (2006.01)
*G02F 1/1333*  (2006.01)
*H05K 5/02*    (2006.01)

(52) U.S. Cl.
CPC ............. *H05K 5/0217* (2013.01); *F16M 11/00* (2013.01); *G09F 9/00* (2013.01); *H04N 5/64* (2013.01); *G02F 1/1333* (2013.01)
USPC ........................................ 411/427

(58) Field of Classification Search
CPC ...... F16B 23/0061; F16B 39/14; B21D 53/24
USPC .......... 411/103, 108, 177, 183, 427, 517, 918
See application file for complete search history.

(56) References Cited

U.S. PATENT DOCUMENTS

| | | | | |
|---|---|---|---|---|
| 2,716,434 A | * | 8/1955 | Crowther | 411/106 |
| 5,039,264 A | * | 8/1991 | Benn | 411/175 |
| 5,339,500 A | * | 8/1994 | Muller et al. | 24/514 |
| 5,893,694 A | * | 4/1999 | Wilusz et al. | 411/112 |
| 6,131,252 A | * | 10/2000 | Hoheisel et al. | 24/514 |
| 6,287,064 B1 | * | 9/2001 | Jhumra et al. | 411/175 |

FOREIGN PATENT DOCUMENTS

JP     2009-251260 A    10/2009

* cited by examiner

*Primary Examiner* — Roberta Delisle

(74) *Attorney, Agent, or Firm* — Sony Corporation

(57) ABSTRACT

Provided is an attachment structure including an attachment portion formed by cutting and erecting a processing portion provided as an inner portion of a notch formed on a plate-like base surface portion and bending the processing portion in a predetermined shape. One of an inner portion of the attachment portion on the base surface portion and the attachment portion has a screw groove to which an attachment screw is to be screwed formed therein.

10 Claims, 25 Drawing Sheets

5···Base surface portion
5a···Notch
6···Attachment portion

1···Display apparatus
4···Back chassis
5···Base surface portion
6···Attachment portion
100···Attachment screw 5···Base surface portion
5a···Notch
6···Attachment portion 4···Back chassis
5···Base surface portion
6···Attachment portion
11b···Screw groove
100···Attachment screw 4···Back chassis
5···Base surface portion
6···Attachment portion
11b···Screw groove
100···Attachment screw 4···Back chassis
5···Base surface portion
6···Attachment portion
11b···Screw groove
100···Attachment screw 5···Base surface portion
5a···Notch
10···Processing portion
11b···Screw groove 5···Base surface portion
5a···Notch
6···Attachment portion
12···Reinforcement portion 5···Base surface portion
5a···Notch
6X···Attachment portion
10a···Concave portion
10b···Convex portion 5···Base surface portion
5d···Notch
6B···Attachment portion
10B···Processing portion
11b···Screw groove 5···Base surface portion
5d···Notch
6B···Attachment portion
10B···Processing portion 5···Base surface portion
5e···Notch
10C···Processing portion
11b···Screw groove 5···Base surface portion
5e···Notch
6C···Attachment portion
11b···Screw groove 5···Base surface portion
5f···Notch
6E···Attachment portion
11b···Screw groove 5···Base surface portion
5a···Notch
10F···Processing portion 5···Base surface portion
5a···Notch
6F···Attachment portion
6f···Screw groove 5···Base surface portion
5a···Notch
6F···Attachment portion
6f···Screw groove

ATTACHMENT STRUCTURE AND DISPLAY APPARATUS

BACKGROUND

The present disclosure relates to an attachment structure and a display apparatus, more specifically, to a technical field of forming an attachment portion by erecting a cut part of a base surface portion and bending it in a predetermined shape, to reduce a production cost and improve a degree of freedom in design regarding an attachment using an attachment screw.

There are various types of electronic apparatuses such as a television receiver, a personal computer, a cellular phone, a mobile terminal apparatus, a disk drive apparatus, and an acoustic apparatus, and those electronic apparatuses include various attachment structures.

In those attachment structures, a predetermined member is attached to other members or other parts by various methods. As an attachment method in the attachment structures as described above, there are, for example, a method that uses an attachment screw and the like, a method that uses welding, a method that uses adhesion, and a method that uses an engagement.

For example, the method that uses an attachment screw in a display apparatus of a television receiver or the like involves forming a screw clamp pedestal by erecting a cut part of a frame or a back chassis and attaching a circuit board to the pedestal using an attachment screw to thus attach it to the frame (see, for example, Japanese Patent Application Laid-open No. 2009-251260; hereinafter, referred to as Patent Document 1).

SUMMARY

In the attachment structure disclosed in Patent Document 1, however, since the pedestal is formed by drawing processing, there is a problem that a height of the pedestal is limited and a degree of freedom in design is low.

Moreover, since a part of the pedestal continuous with a part to which the attachment screw is to be attached is formed as a tilted portion, there is a problem that, for preventing a predetermined portion, for example, an electronic component mounted on the circuit board, from not interfering with the tilted portion, the design of the circuit board is limited and thus the degree of freedom in design is lowered.

On the other hand, as another example of the attachment structure, there is a structure in which a pedestal is formed by performing emboss processing on a part of a frame or a back chassis, and a screw hole is formed at a center portion of the pedestal so that an attachment screw can be attached via the screw hole. In this case, however, since a tilted portion is caused by the emboss processing, the degree of freedom in design is lowered by the same reason as in the case of forming a tilted portion described above.

Furthermore, as another example of the attachment structure, there is a structure in which a substantially-cylindrical stud including a screw hole is coupled to a frame or a back chassis by a swage or the like, and an attachment is performed using an attachment screw via the stud. In the case of using the stud as described above, however, since the stud and the frame are different members, there is a problem that a production cost regarding the attachment structure becomes high.

In this regard, there is a need for an attachment structure and a display apparatus with which a production cost can be reduced and a degree of freedom in design can be improved regarding an attachment using an attachment screw.

First, according to an embodiment of the present disclosure, there is provided an attachment structure including an attachment portion formed by cutting and erecting a processing portion provided as an inner portion of a notch formed on a plate-like base surface portion and bending the processing portion in a predetermined shape, one of an inner portion of the attachment portion on the base surface portion and the attachment portion having a screw groove to which an attachment screw is to be screwed formed therein.

Therefore, in the attachment structure, a part of the plate-like base surface portion is formed as the attachment portion, and the attachment screw is screwed to the screw groove.

Second, in the attachment structure, the attachment portion may be cylindrical.

By forming the attachment portion to be cylindrical, the shape of the attachment portion becomes simple.

Third, in the attachment structure, the screw groove may be formed on an inner circumferential surface of the attachment portion.

By forming the screw groove on the inner circumferential surface of the attachment portion, the screwing portion of the attachment screw becomes large.

Fourth, in the attachment structure, the base surface portion may include a reinforcement portion that reinforces the attachment portion, the reinforcement portion being formed by cutting and erecting a part of the base surface portion and bonding it to the attachment portion.

By providing the reinforcement portion that reinforces the attachment portion, the reinforcement portion being formed by cutting and erecting a part of the base surface portion and bonding it to the attachment portion, a different member does not need to be provided as the reinforcement portion.

Fifth, in the attachment structure, the processing portion may be provided at a plurality of portions of the base surface portion, and the attachment portion may be formed by bending the plurality of processing portions.

By providing the processing portion at the plurality of portions of the base surface portion and forming the attachment portion by bending the plurality of processing portions, a degree of freedom in setting the shape and size of the processing portions is improved.

Sixth, in the attachment structure, a part of each of the plurality of processing portions may be superimposed in a thickness direction.

By superimposing a part of each of the plurality of processing portions in the thickness direction, the thickness of the superimposed part of the attachment portion becomes large.

Seventh, in the attachment structure, the screw groove may be formed at a portion where the part of each of the plurality of processing portions is superimposed.

By forming the screw groove at the portion where the part of each of the plurality of processing portions is superimposed, the screwing portion of the attachment screw becomes large.

Eighth, in the attachment structure, the attachment portion may be capable of being elastically deformed in an axial direction of the attachment screw with respect to the screw groove.

By enabling the attachment portion to be elastically deformed in the axial direction of the attachment screw with respect to the screw groove, even when the attachment screw becomes loose due to a vibration, a secular change, and the like, the attachment portion is elastically deformed following the loosening of the attachment screw.

Ninth, in the attachment structure, the attachment portion may include a concave portion and a convex portion at both end portions thereof in a circumferential direction, the concave portion and the convex portion at the both end portions fitting with each other.

By the attachment portion including the concave portion and the convex portion at the both end portions thereof in the circumferential direction, the concave portion and the convex portion at the both end portions fitting with each other, the both end portions of the attachment portion in the circumferential direction are bonded.

According to an embodiment of the present disclosure, there is provided a display apparatus including a display on which an image is displayed, and a back chassis including a plate-like base surface portion.

The base surface portion includes an attachment portion formed by cutting and erecting a processing portion provided as an inner portion of a notch formed on the base surface portion and bending the processing portion in a predetermined shape. One of an inner portion of the attachment portion on the base surface portion and the attachment portion has a screw groove to which an attachment screw is to be screwed formed therein.

Therefore, in the attachment structure of the display apparatus, a part of the base surface portion is formed as the attachment portion, and the attachment screw is screwed to the screw groove.

According to the embodiment of the present disclosure, there is provided an attachment structure including an attachment portion formed by cutting and erecting a processing portion provided as an inner portion of a notch formed on a plate-like base surface portion and bending the processing portion in a predetermined shape, one of an inner portion of the attachment portion on the base surface portion and the attachment portion having a screw groove to which an attachment screw is to be screwed formed therein.

With this structure, there is no need to perform drawing processing in forming the attachment portion, the height is not limited, and a tilted portion is not formed. As a result, the degree of freedom in design can be improved.

In addition, since the attachment portion is integrally formed with the base surface portion, the production cost can be reduced.

In this embodiment, the attachment portion is cylindrical.

With this structure, the shape of the attachment portion is simple, and thus the attachment portion can be formed with a reduced production cost and a simplified structure.

In this embodiment, the screw groove is formed on an inner circumferential surface of the attachment portion.

With this structure, the screwing portion of the attachment screw becomes large, with the result that an attachment state using the attachment screw can be stabilized.

In this embodiment, the base surface portion includes a reinforcement portion that reinforces the attachment portion, the reinforcement portion being formed by cutting and erecting a part of the base surface portion and bonding it to the attachment portion.

With this structure, since there is no need to provide a different member as the reinforcement portion, the attachment portion can be reinforced without raising the production cost.

In this embodiment, the processing portion is provided at a plurality of portions of the base surface portion, and the attachment portion is formed by bending the plurality of processing portions.

With this structure, the degree of freedom in setting the shape and size of the processing portion increases, with the result that the degree of freedom in designing the attachment portion can be improved.

In this embodiment, a part of each of the plurality of processing portions is superimposed in a thickness direction.

With this structure, due to a large thickness, a high rigidity can be secured that much.

In this embodiment, the screw groove is formed at a portion where the part of each of the plurality of processing portions is superimposed.

With this structure, the screwing portion of the attachment screw becomes large, with the result that the attachment state using the attachment screw can be stabilized.

In this embodiment, the attachment portion can be elastically deformed in an axial direction of the attachment screw with respect to the screw groove.

With this structure, since the attachment portion can be elastically deformed following the loosening of the attachment screw even when the attachment screw is loosened due to a vibration, a secular change, and the like, a coupling force of the attachment screw does not change, and a stable attachment state using the attachment screw can be secured.

In this embodiment, the attachment portion includes a concave portion and a convex portion at both end portions thereof in a circumferential direction, the concave portion and the convex portion at the both end portions fitting with each other.

Therefore, it is possible to prevent the both end portions of the attachment portion in the circumferential direction from opening by a simple structure.

According to the embodiment of the present disclosure, there is provided a display apparatus including a display on which an image is displayed, and a back chassis including a plate-like base surface portion.

The base surface portion includes an attachment portion formed by cutting and erecting a processing portion provided as an inner portion of a notch formed on the base surface portion and bending the processing portion in a predetermined shape. One of an inner portion of the attachment portion on the base surface portion and the attachment portion has a screw groove to which an attachment screw is to be screwed formed therein.

With this structure, there is no need to perform the drawing processing in forming the attachment portion of the back chassis, the height is not limited, and a tilted portion is not formed. As a result, the degree of freedom in design can be improved.

In addition, since the attachment portion of the back chassis is integrally formed with the base surface portion, the production cost can be reduced.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure for embodying an attachment structure and display apparatus of the present disclosure will be described with reference to the drawings.

In the embodiment below, the display apparatus of the present disclosure is applied to a television receiver, and the attachment structure of the present disclosure is applied to an attachment structure of the television receiver.

It should be noted that an applicable range of the display apparatus of the present disclosure is not limited to the television receiver, and the present disclosure is widely applicable to various display apparatuses other than the television receiver, such as a personal computer and a monitor.

Moreover, an applicable range of the attachment structure of the present disclosure is not limited to the attachment structure of the television receiver, and the present disclosure is widely applicable to an attachment structure of various display apparatuses other than the television receiver, such as a personal computer and a monitor, and an attachment structure of electronic apparatuses other than the display apparatus.

Examples of such an electronic apparatus include various apparatuses such as a personal computer, a cellular phone, a mobile terminal apparatus, a disk drive apparatus, and an acoustic apparatus.

(Schematic Structure of Display Apparatus)

Figure 1:
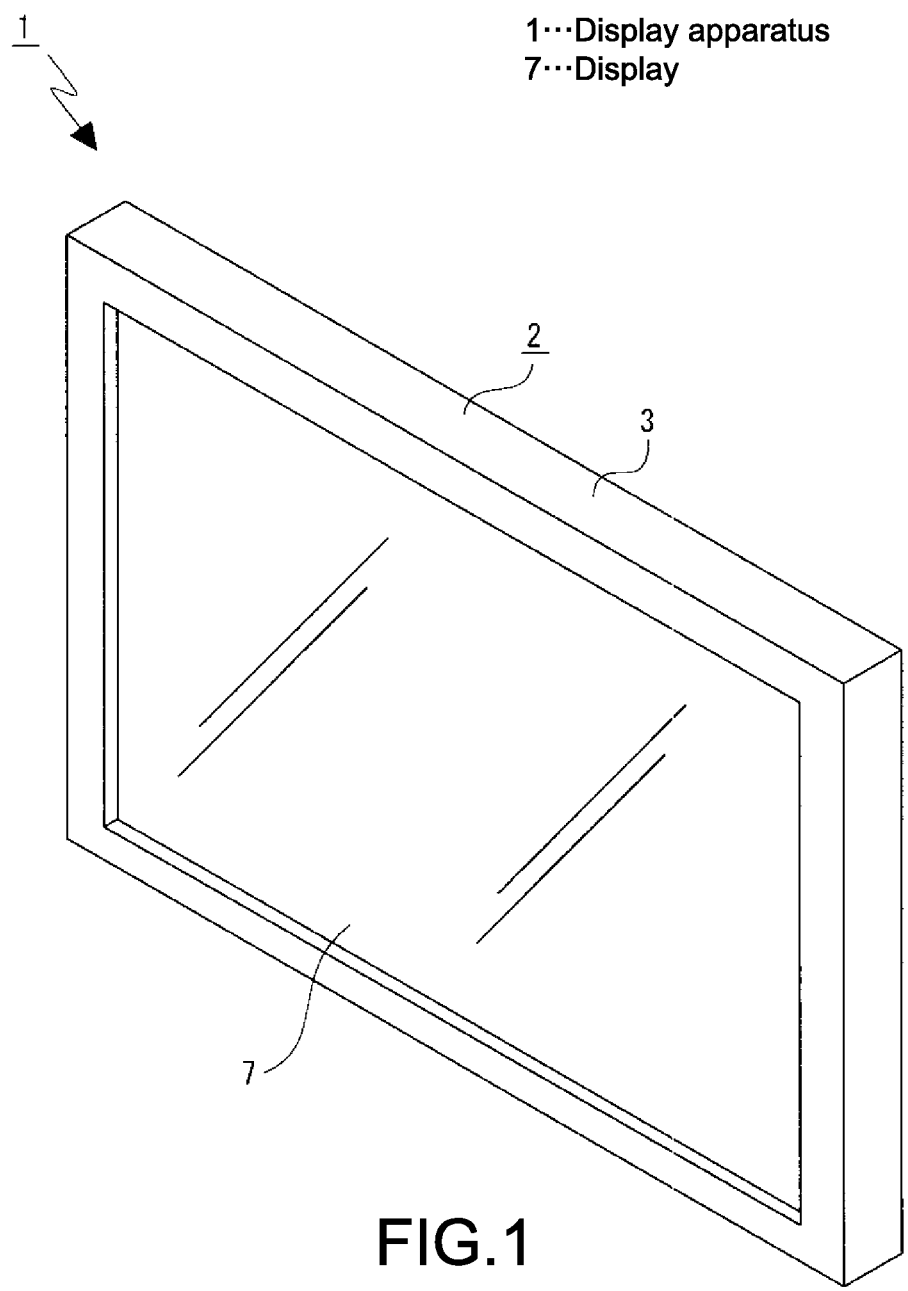
FIG. 1 is a perspective view of a display apparatus according to an embodiment of the present disclosure.
Figure 2:
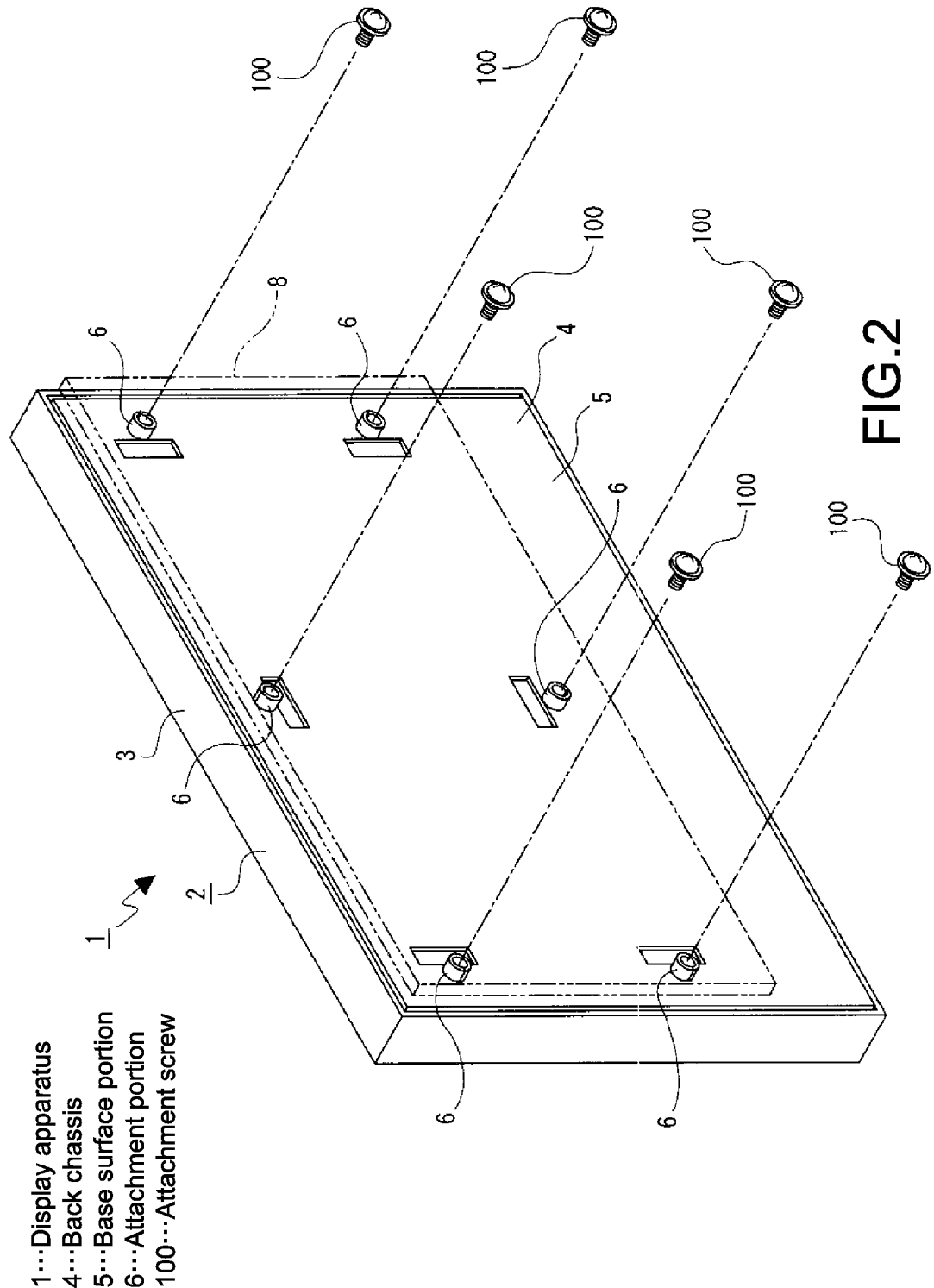
FIG. 2 is a perspective view of the display apparatus taken from a side opposite from that of FIG. 1.

First, a schematic structure of a display apparatus 1 will be described (see FIGS. 1 and 2).

The display apparatus (television receiver) 1 is, for example, horizontally long and formed in a practically-rectangular flat shape, and requisite portions are arranged in a casing 2. The display apparatus 1 is held by a stand (not shown), for example.

The casing 2 includes a bezel 3 on a front side, a back chassis 4 on a back side, and a rear cover (not shown) attached to a back surface side of the back chassis 4.

The bezel 3 is formed as a practically-rectangular frame. It should be noted that the bezel 3 is constituted of 4 members as 4 independent sides in longitudinal and lateral directions. The 4 members may be coupled to form a frame, or the 4 members may be formed integrally.

The back chassis 4 includes a horizontally-long base surface portion 5 facing a front-back direction and a plurality of attachment portions 6 each formed by cutting and erecting a part of the base surface portion 5.

The attachment portions 6 will be described later in detail.

It should be noted that the attachment portion does not need to be provided on the back chassis 4 and may be provided on other members of the display apparatus 1.

Inside the casing 2, a display 7 is held by the bezel 3. Although not shown, on a back surface side of the display 7, a diffuser plate for diffusing light that enters the display 7, a plurality of optical sheets having predetermined functions with respect to light that enters the display 7, a light source that functions as a backlight, a light guide plate that guides light in a predetermined direction, and the like are arranged.

Attached to the attachment portions 6 of the back chassis 4 is a circuit board 8. On front and back surfaces of the circuit board 8, predetermined electronic components (chip components) 9 are mounted.

It should be noted that the attachment portions 6 may be provided for attaching other members of the display apparatus 1 instead of the circuit board 8.

(Structure of Attachment Portion)

Next, a structure of the attachment portions 6 will be described (see FIGS. 3 to 11).

Figure 3:
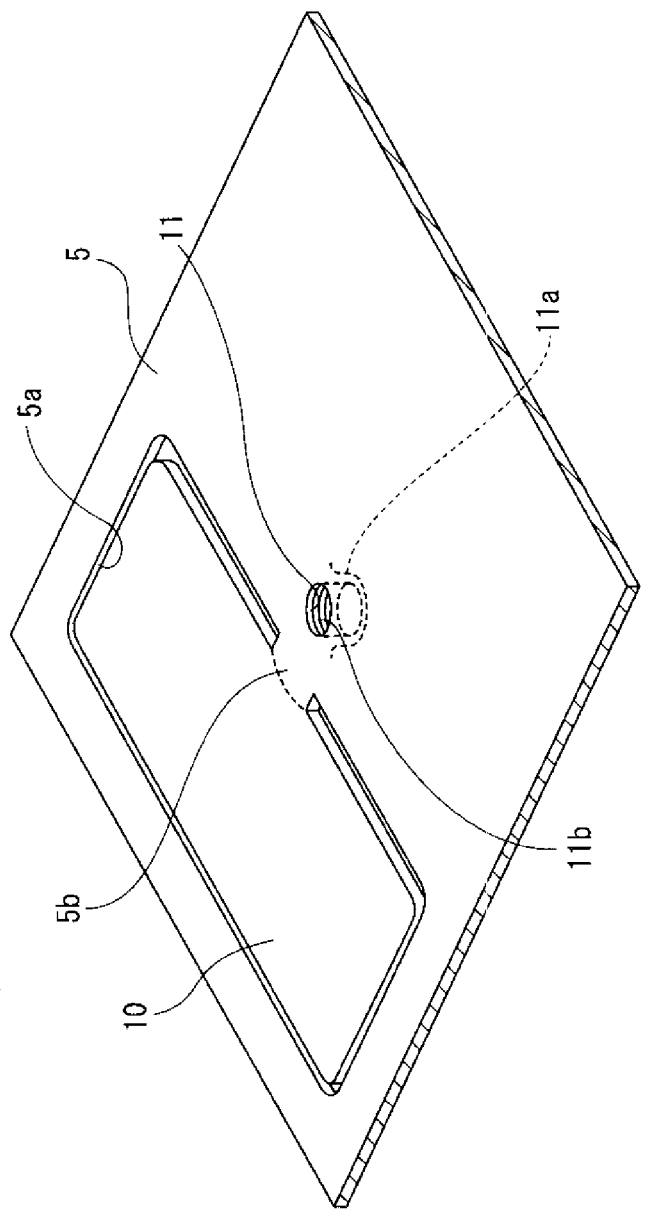
FIG. 3 is an enlarged perspective view showing a state before an attachment portion is formed.
Figure 4:
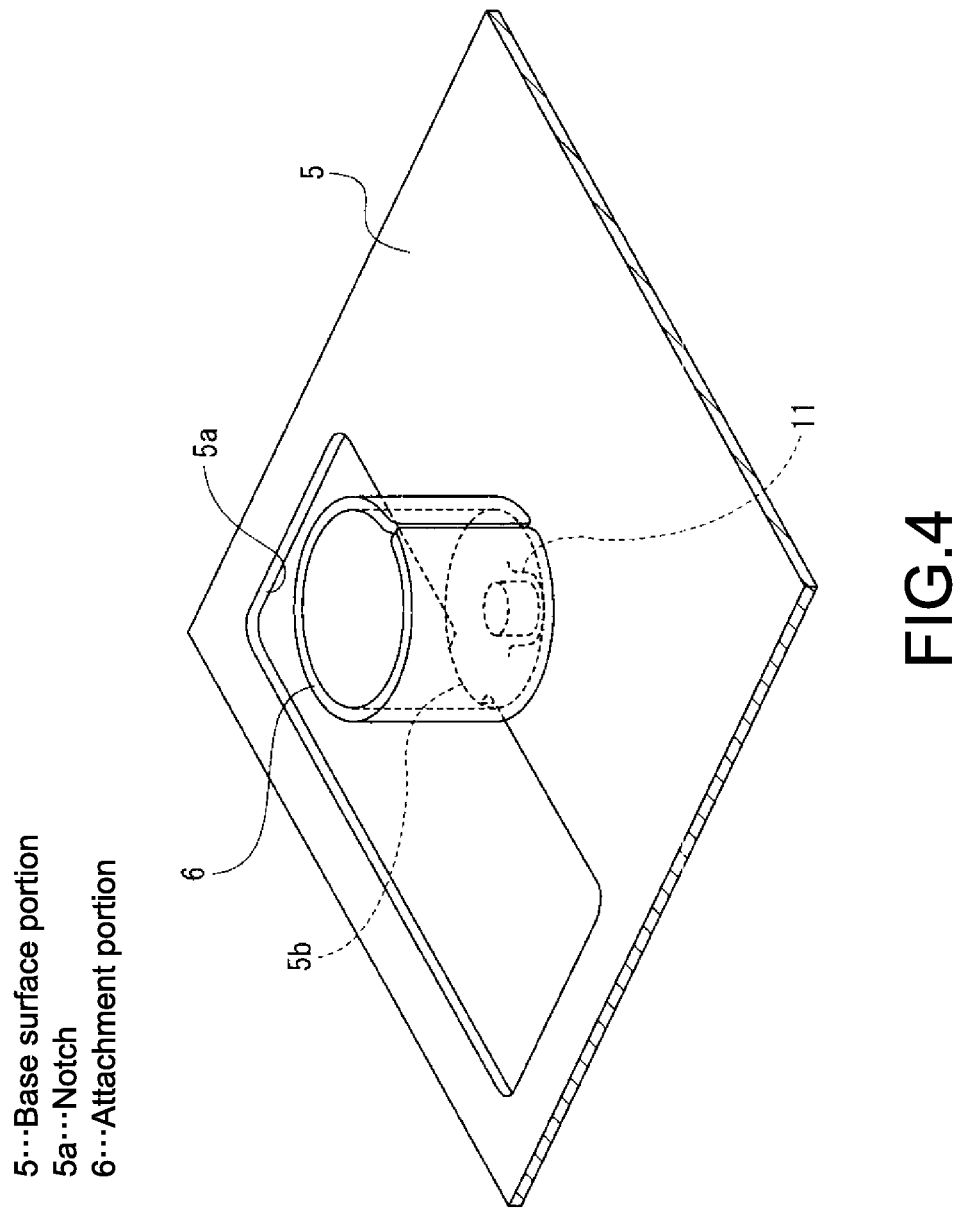
FIG. 4 is an enlarged perspective view showing a state where the attachment portion is formed.

The attachment portions 6 are each formed by cutting and erecting a part of the base surface portion 5 of the back chassis 4 (see FIGS. 3 and 4).

A practically-rectangular notch 5a is formed on the base surface portion 5, for example, and an inner portion of the notch 5a is formed as a horizontally-long rectangular processing portion 10 (see FIG. 3). The processing portion 10 is continuous with other portions of the base surface portion 5 via a continuous portion 5b.

Therefore, the notch 5a is formed in a shape including the continuous portion 5b.

On the base surface portion 5, a screw clamp portion 11 is provided in the vicinity of the continuous portion 5b. The screw clamp portion 11 is structured by forming a screw groove 11b on an inner circumferential surface of a cylindrical portion 11a formed by performing burring processing on a part of the base surface portion 5.

The processing portion 10 is erected 90 degrees and bent to form the cylindrical attachment portion 6 (see FIG. 4). Both end edges of the attachment portion 6 in a circumferential direction are close to or in contact with each other. It should be noted that the attachment portion 6 does not need to be cylindrical, and a gap may be formed between both end edges of an arc-shaped attachment portion 6 in the circumferential direction.

In a state where the attachment portion 6 is formed, the screw clamp portion 11 is positioned on an inner side of the attachment portion 6, and the screw clamp portion 11 is positioned at a center portion of the attachment portion 6, for example.

By forming the attachment portion 6 to be cylindrical as described above, the shape of the attachment portion 6 becomes simple, and thus the attachment portion 6 can be formed with a reduced production cost and a simplified structure.

Figure 5:
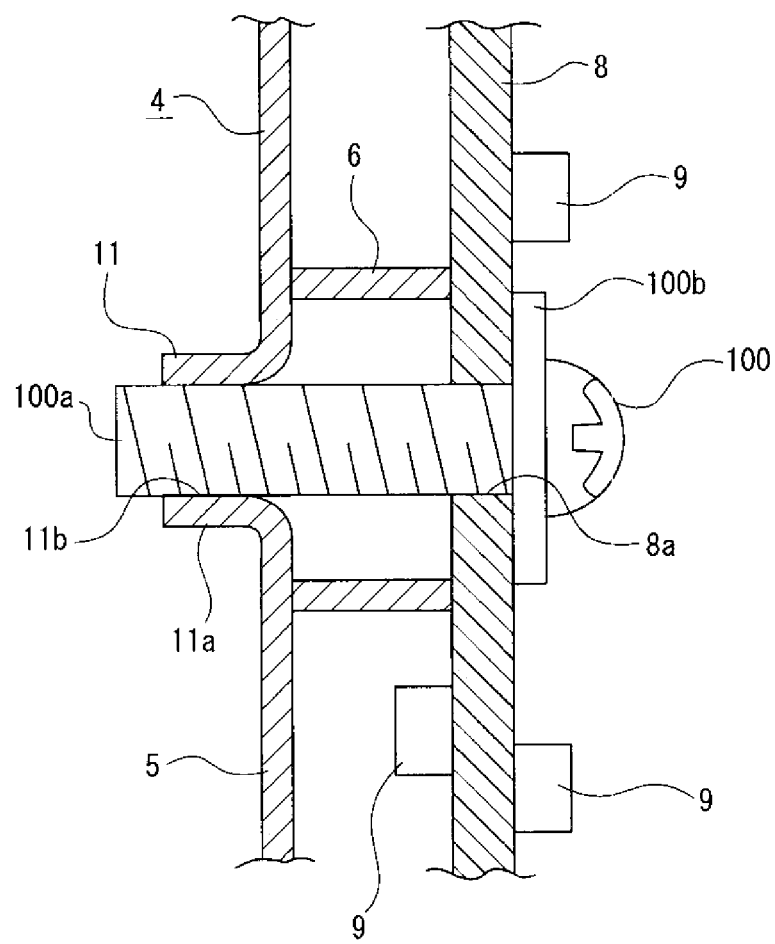
FIG. 5 is an enlarged cross-sectional diagram showing a state where a circuit board is attached by an attachment screw.

The circuit board 8 is mounted on the attachment portions 6 structured as described above, and a screw shaft portion 100a of an attachment screw 100 is inserted into an insertion hole 8a formed on the circuit board 8 to be screwed to the screw groove 11b (see FIG. 5). A head portion 100b of each of the attachment screws 100 is pressed against the circuit board 8, and the circuit board 8 is attached to the attachment portions 6 by the attachment screws 100 to be fixed to the back chassis 4.

The attachment portion 6 is vertical to the circuit board 8, and there is no tilted portion in the attachment portion 6. Therefore, it is difficult for the electronic component 9 located in the vicinity of the insertion hole 8a to come into contact with the attachment portion 6, with the result that there is not much limitation on a mounting position of the electronic components 9 on the circuit board 8. In addition, the degree of freedom in design can be improved, and the circuit board 8 can be downsized.

Figure 6:
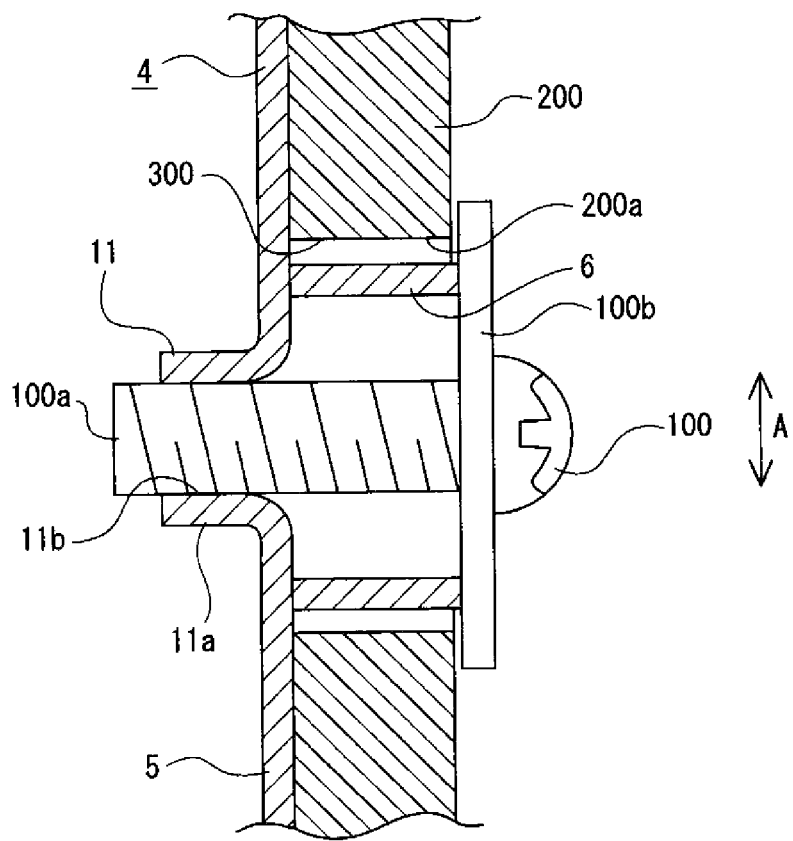
FIG. 6 is an enlarged cross-sectional diagram showing a state where a structural body is attached by the attachment screw.

It should be noted that although the descriptions above are given on the attachment example in the display apparatus 1, another structure 200 may be attached by the attachment screws 100 in various electronic apparatuses including the display apparatus 1 (see FIG. 6). The structure 200 includes an insertion hole 200a into which the attachment portion 6 is inserted, and an inner diameter of the insertion hole 200a is larger than an outer diameter of the attachment portion 6.

In such a structure, the screw shaft portion 100a of the attachment screw 100 is screwed to the screw groove 11b while the attachment portion 6 is inserted into the insertion hole 200a of the structure 200, and the structure 200 is attached while being pressed by the head portion 100b of the attachment screw 100 to be pressed against the base surface portion 5. At this time, a gap 300 is formed between an outer circumferential surface of the attachment portion 6 and the insertion hole 200a of the structure 200.

For example, when a temperature changes in an environment of the display apparatus 1, the positions of the attachment portion 6 and the structure 200 may change due to a difference between linear expansion coefficients of the attachment portion 6 and the structure 200. However, since the gap 300 is formed between the attachment portion 6 and the structure 200, even when the positions of the structure 200 and the attachment portion 6 are relatively changed in the A direction shown in FIG. 6 by an expansion or contraction due to the temperature change, the attachment portion 6 and the structure 200 are not distorted, and a stable attachment state can be secured.

Figure 7:
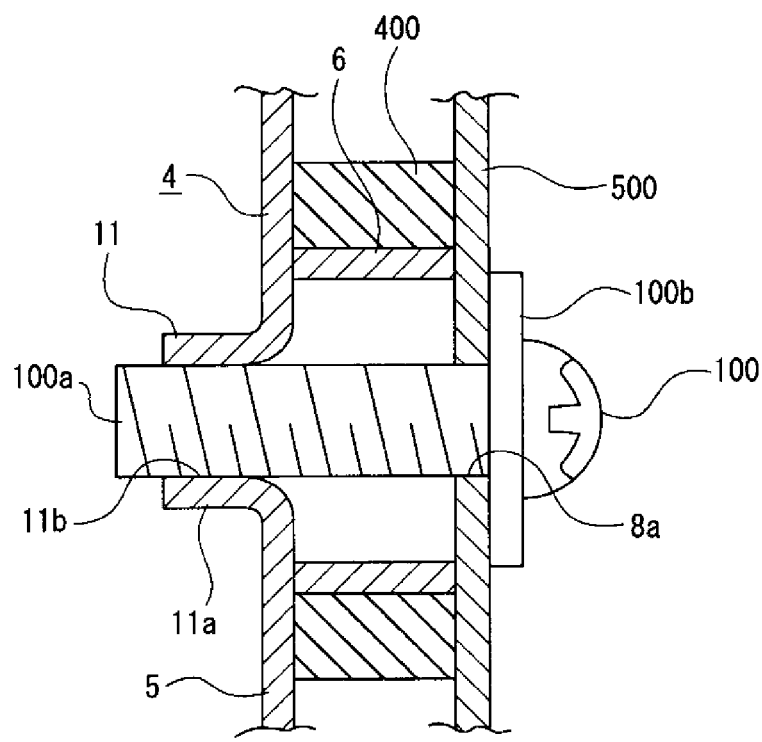
FIG. 7 is an enlarged cross-sectional diagram showing a state where another structural body is attached by the attachment screw.

It is also possible to arrange a cylindrical rubber bush 400 on an outer circumferential side of the attachment portion 6 and attach a structure 500 to the attachment portion 6 by the attachment screw 100 (see FIG. 7). As such an attachment, there is an example where the structure 500 such as a speaker is attached by the attachment screw 100.

By attaching the structure (speaker) 500 via the rubber bush 400 as described above, the rubber bush 400 functions as a damping member. As a result, an excessive vibration of the structure 500 such as a speaker can be suppressed.

Figure 8:
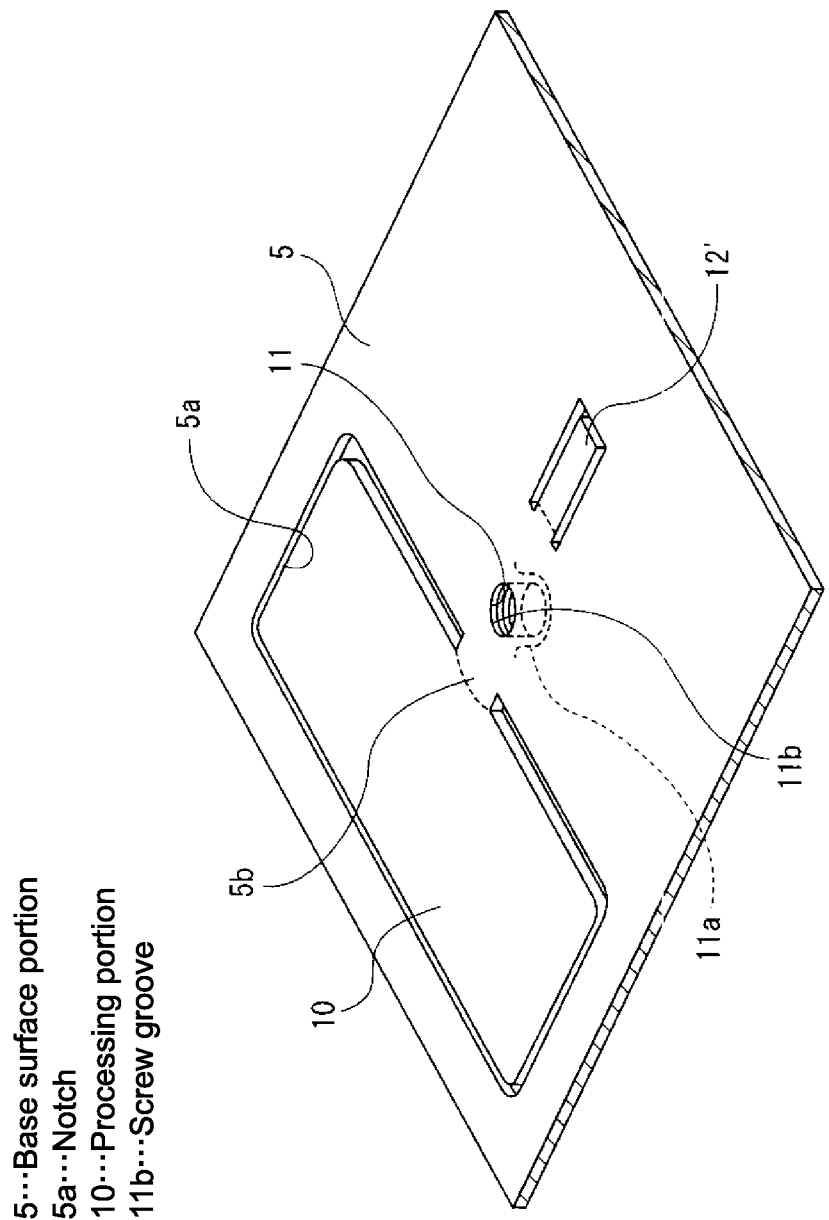
FIG. 8 is an enlarged perspective view showing a state before a reinforcement portion is formed.
Figure 9:
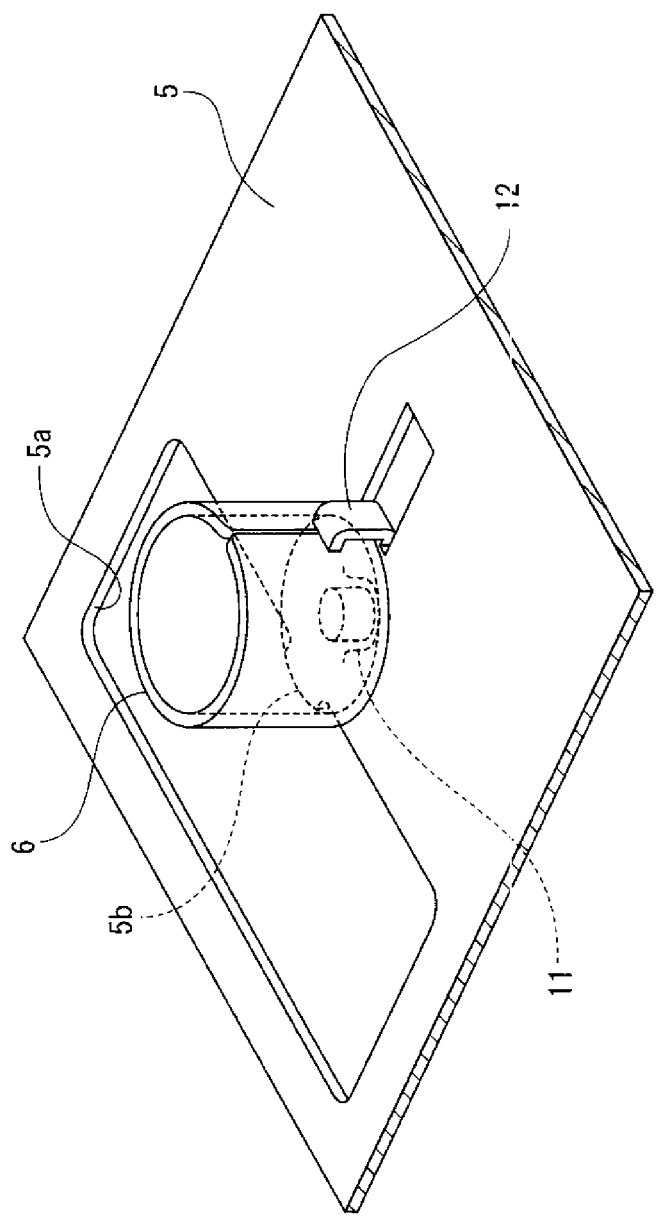
FIG. 9 is an enlarged perspective view showing a state where the reinforcement portion is formed.

It should be noted that for reinforcing the attachment portion 6, a reinforcement portion 12 as follows may be formed, for example (see FIGS. 8 and 9).

The reinforcement portion 12 is provided on the other side of the continuous portion 5b on the base surface portion 5 with the screw clamp portion 11 being interposed therebetween, for example, and formed by cutting and erecting a part 12' of the base surface portion 5. The reinforcement portion 12 is bonded by adhesion, welding, or the like while a tip end portion thereof is bridged between the both end portions of the attachment portion 6 in the circumferential direction. By the reinforcement portion 12, the both end portions of the attachment portion 6 in the circumferential direction are prevented from opening.

By forming the reinforcement portion 12 by cutting and erecting the part 12' of the base surface portion 5 as described above, a different member does not need to be used as the reinforcement portion, and thus the attachment portion 6 can be reinforced without raising the production cost.

Figure 10:
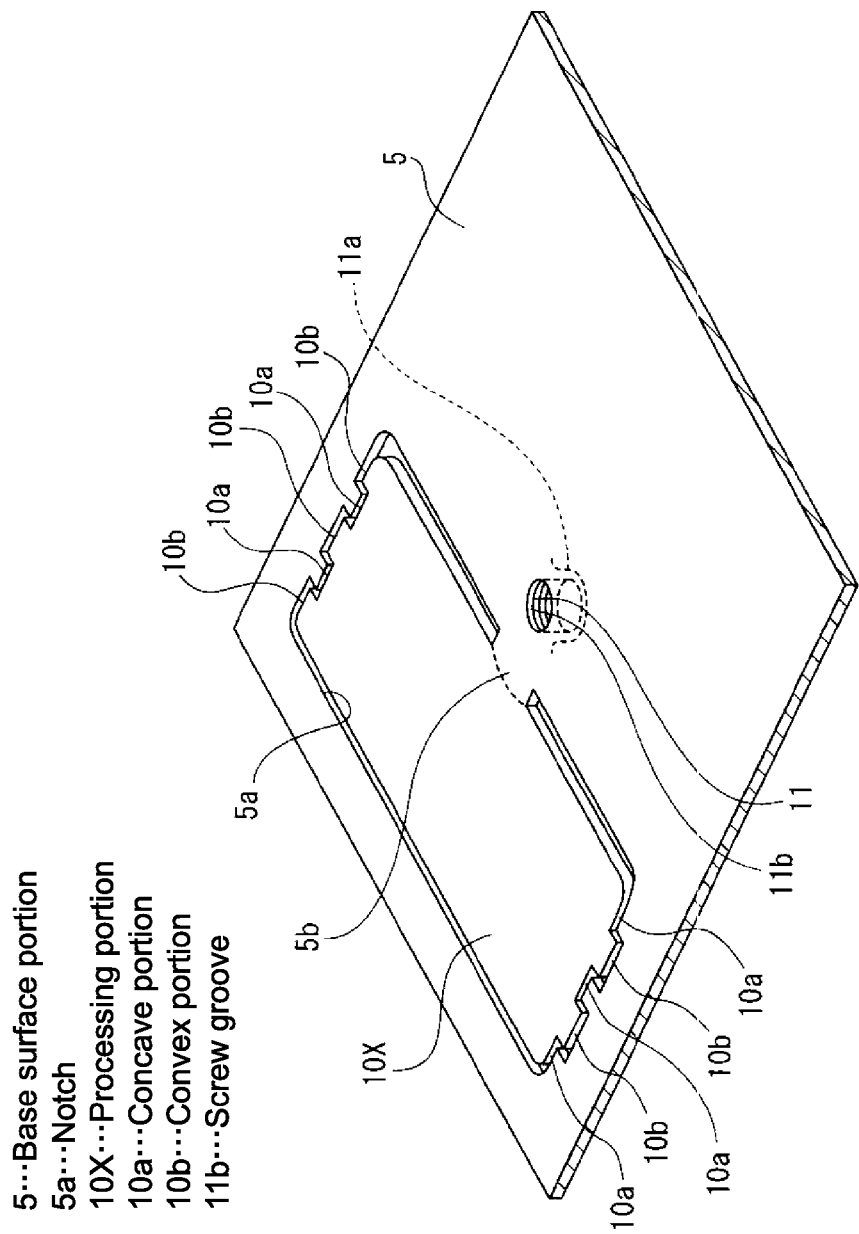
FIG. 10 is an enlarged perspective view showing a state before an attachment portion including a concave portion and a convex portion is formed.
Figure 11:
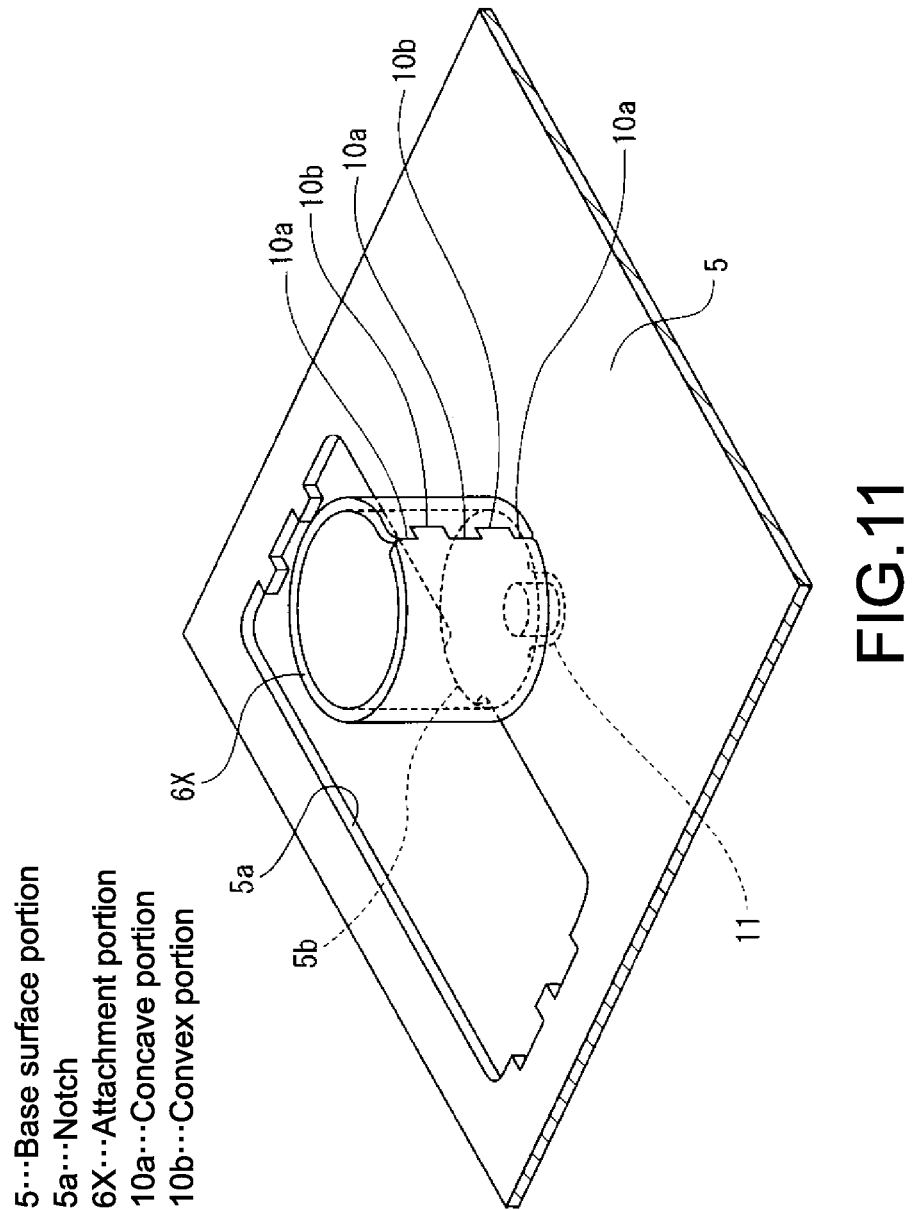
FIG. 11 is an enlarged perspective view showing a state where the attachment portion including the concave portion and the convex portion is formed.

It should be noted that although the descriptions above are given on the example where the processing portion 10 is formed to be rectangular, it is also possible to form, instead of the processing portion 10, a processing portion 10X in which concave portions 10a and convex portions 10b are formed alternately at both end portions thereof in a longitudinal direction (see FIGS. 10 and 11).

By cutting and erecting the processing portion 10X and fitting the concave portions 10a and the convex portions 10b with each other to form an attachment portion 6X, both end portions of the attachment portion 6X in the circumferential direction can be prevented from opening by a simple structure.

(Modified Example of Attachment Portion)

Hereinafter, modified examples of the attachment portion will be described (see FIGS. 12 to 25).

Modified Example 1

Figure 12:
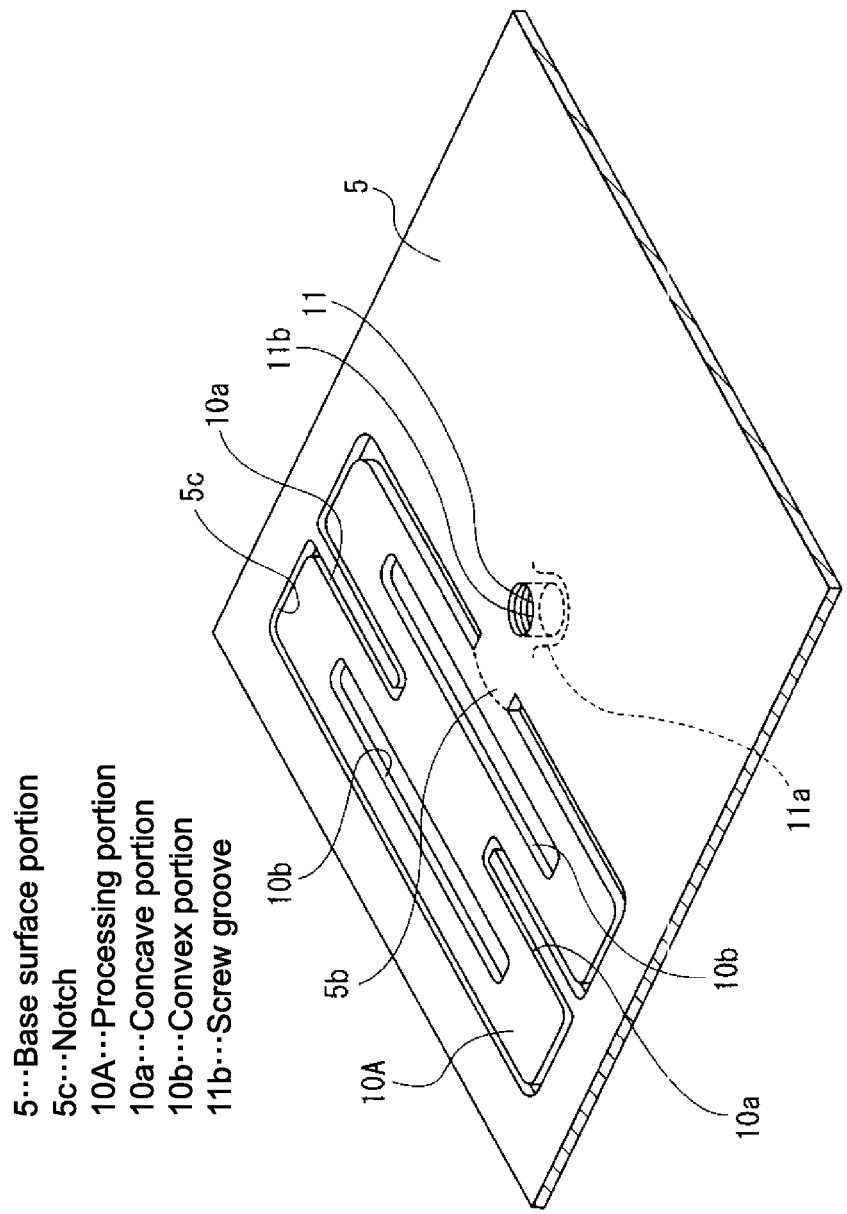
FIG. 12 is an enlarged perspective view showing a state before an attachment portion according to Modified Example 1 is formed.
Figure 13:
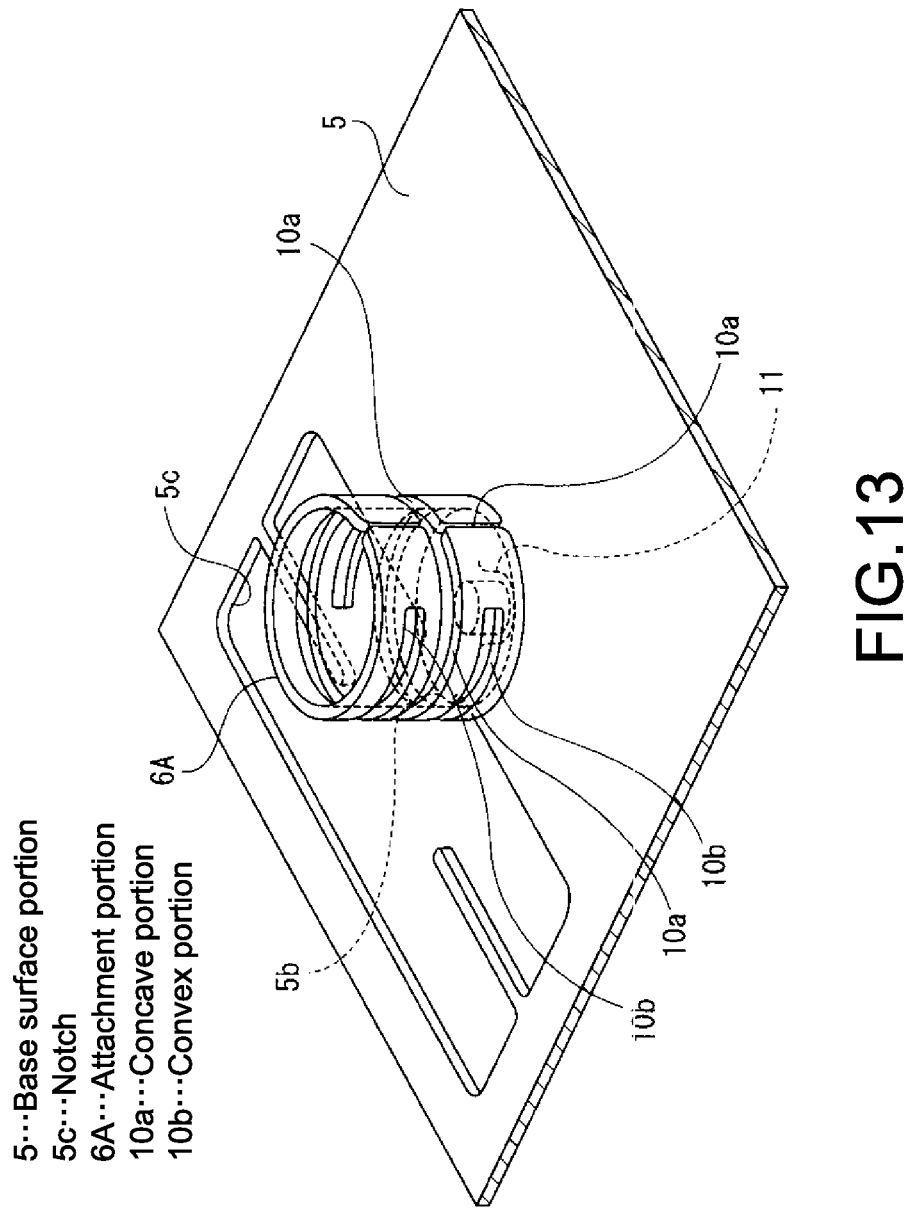
FIG. 13 is an enlarged perspective view showing a state where the attachment portion according to Modified Example 1 is formed.

An attachment portion 6A according to Modified Example 1 is formed by cutting and erecting a part of the base surface portion 5 of the back chassis 4 (see FIGS. 12 and 13).

A notch 5c having a predetermined shape is formed on the base surface portion 5, for example, and by the notch 5c, an inner portion thereof is formed as a horizontally-long rectangular processing portion 10A (see FIG. 12). The processing portion 10A is continuous with other portions of the base surface portion 5 via the continuous portion 5b. Therefore, the notch 5c is formed in a shape including the continuous portion 5b.

In the processing portion 10A, slits 10a are formed apart from each other in the lateral direction. The slits 10a are opened outwardly (laterally) and extend laterally. In the processing portion 10A, slits 10b extending laterally are formed above and below the slits 10a. Both end portions of the slits 10b in the lateral direction are located right above or below a part of the slits 10a, and parts of the slits 10a and the slits 10b overlap one another in the longitudinal direction.

On the base surface portion 5, the screw clamp portion 11 is provided in the vicinity of the continuous portion 5b.

The processing portion 10A is erected 90 degrees and bent so as to form the practically-cylindrical attachment portion 6A (see FIG. 13). Both end edges of the attachment portion 6A in the circumferential direction are close to or in contact with each other. It should be noted that the attachment portion 6A does not need to be cylindrical, and a gap may be formed between both end edges of an arc-shaped attachment portion 6A in the circumferential direction.

In a state where the attachment portion 6A is formed, the screw clamp portion 11 is positioned on an inner side of the attachment portion 6A, and the screw clamp portion 11 is positioned at a center portion of the attachment portion 6A, for example.

Since the attachment portion 6A includes the slits 10a and 10b extending in the circumferential direction, the attachment portion 6A can be elastically deformed in the axial direction.

By enabling the attachment portion 6A to be elastically deformed as described above, since the attachment portion 6A can be elastically deformed following the loosening of the attachment screw 100 even when the attachment screw 100 is loosened due to a vibration, a secular change, and the like, a coupling force of the attachment screw 100 does not change, and a stable attachment state using the attachment screw 100 can be secured.

Particularly when the attachment portion 6A is brought into contact with a ground portion formed on the circuit board 8 so that the ground portion is earthed via the attachment portion 6A, since the attachment portion 6A is elastically deformed following the loosening of the attachment screw 100, a favorable in-contact state can be secured between the attachment portion 6A and the ground portion of the circuit board 8 irrespective of the loosening of the attachment screw 100, and thus a favorable earthed state can be secured.

Furthermore, by forming the attachment portion 6A to be practically cylindrical, the shape of the attachment portion 6A becomes simple, and thus the attachment portion 6A can be formed with a reduced production cost and a simple structure.

Modified Example 2

Figure 14:
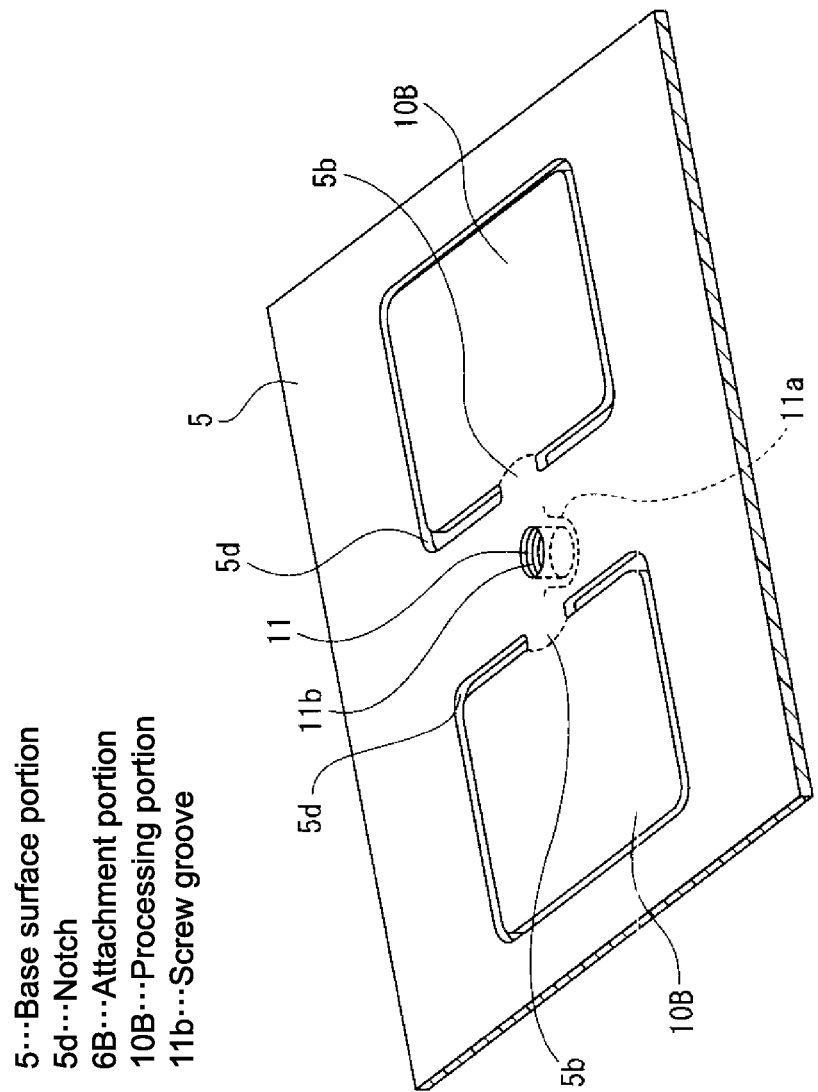
FIG. 14 is an enlarged perspective view showing a state before an attachment portion according to Modified Example 2 is formed.
Figure 15:
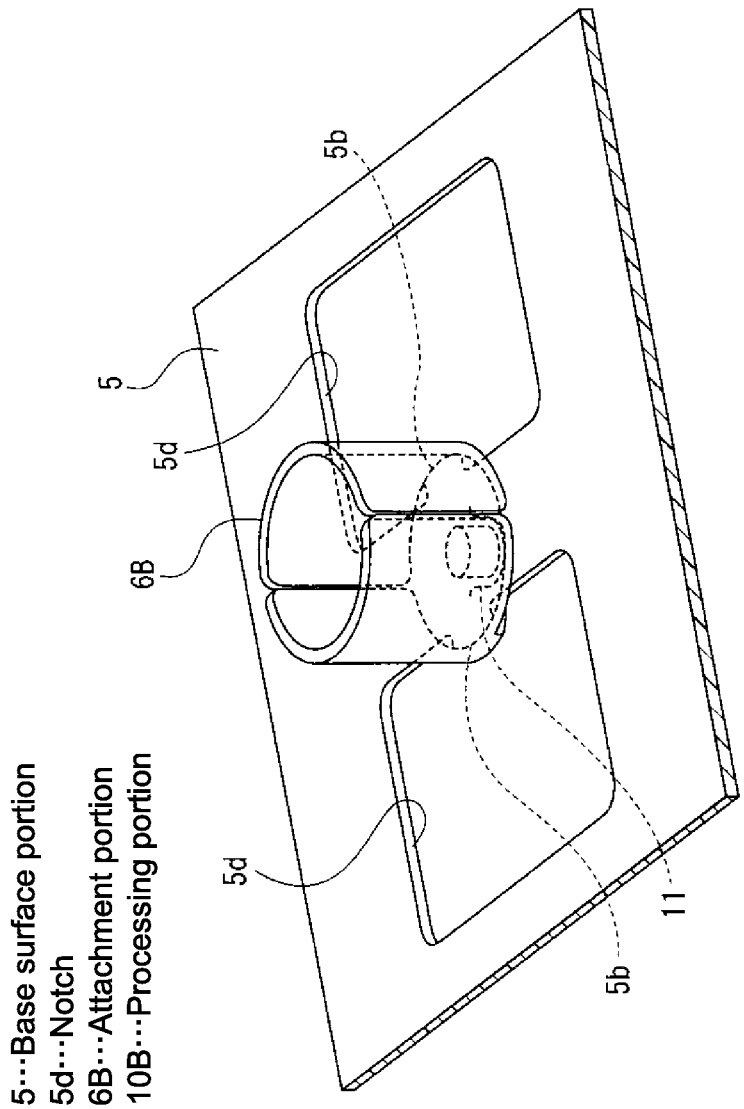
FIG. 15 is an enlarged perspective view showing a state where the attachment portion according to Modified Example 2 is formed.

An attachment portion 6B according to Modified Example 2 is formed by cutting and erecting two parts of the base surface portion 5 of the back chassis 4 (see FIGS. 14 and 15).

Practically-rectangular notches 5d are formed on the base surface portion 5, for example, and by the notches 5d, inners portions thereof are formed as rectangular processing portions 10B (see FIG. 14). The processing portions 10B are continuous with other portions of the base surface portion 5 via the continuous portions 5b. Therefore, the notches 5d are each formed in a shape including the continuous portion 5b.

On the base surface portion 5, the screw clamp portion 11 is provided between the continuous portions 5b.

The processing portions 10B are erected 90 degrees in a direction in which the processing portions 10B approach each other, and in the opposing state, the processing portions 10B are bent in an arc shape to thus form a cylindrical attachment portion 6B (see FIG. 15). Both end edges of the processing portion 10B in the circumferential direction are close to or in contact with the both end edges of the other processing portion 10B. It should be noted that the attachment portion 6B does not need to be cylindrical, and a gap may be formed between both end edges of the arcs in the circumferential direction.

In the state where the attachment portion 6B is formed, the screw clamp portion 11 is positioned on an inner side of the attachment portion 6B at a center portion of the attachment portion 6B, for example.

Since the attachment portion 6B is formed by bending the processing portions 10B provided at a plurality of portions on the base surface portion 5 as described above, the degree of freedom in setting the shape and size of the processing portions 10B is high, and thus the degree of freedom in designing the attachment portion 6B can be improved.

Moreover, since the attachment portion 6B is cylindrical, the shape of the attachment portion 6B is simple, and thus the attachment portion 6B can be formed with a reduced production cost and a simple structure.

Modified Example 3

Figure 16:
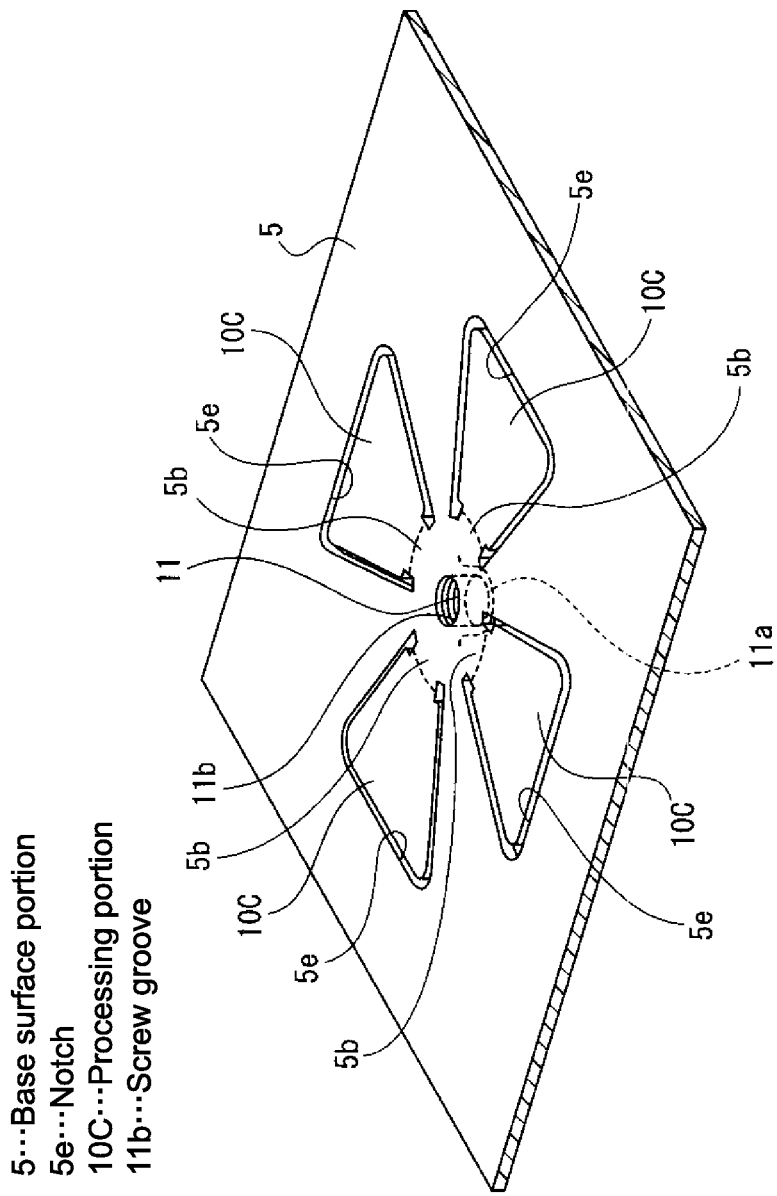
FIG. 16 is an enlarged perspective view showing a state before an attachment portion according to Modified Example 3 is formed.
Figure 17:
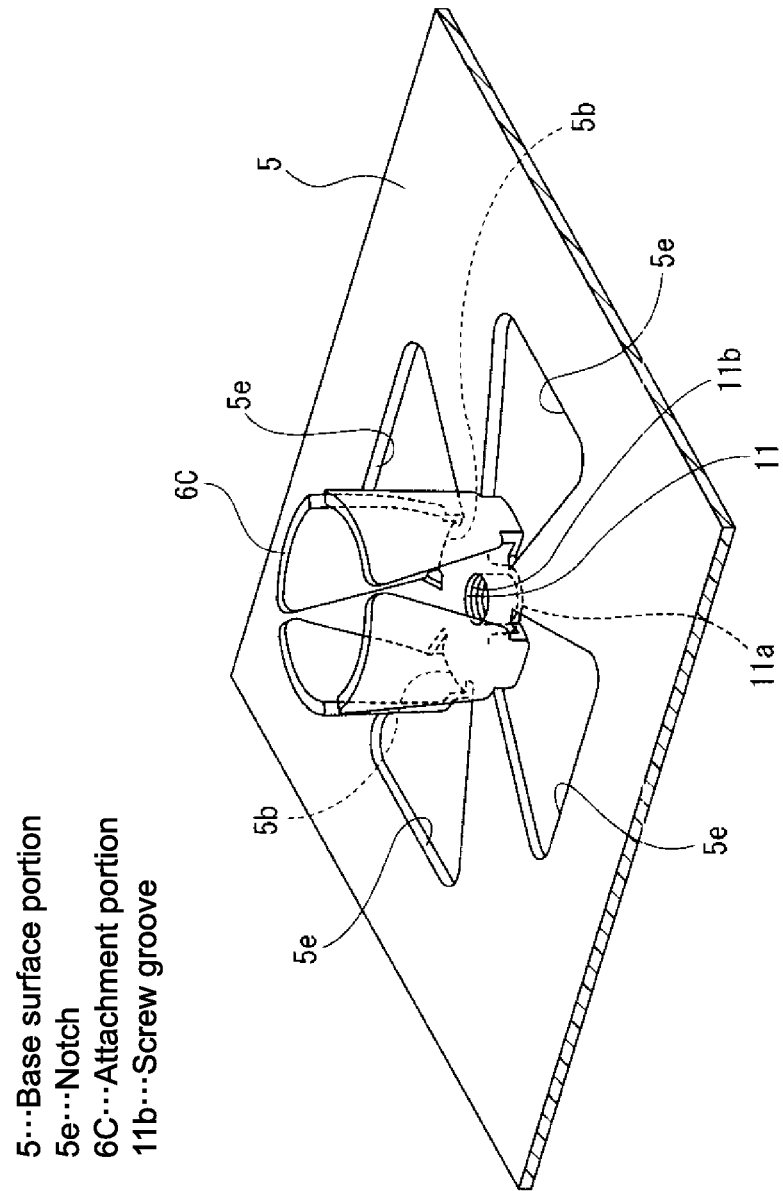
FIG. 17 is an enlarged perspective view showing a state where the attachment portion according to Modified Example 3 is formed.

An attachment portion 6C according to Modified Example 3 is formed by cutting and erecting 4 parts of the base surface portion 5 of the back chassis 4 (see FIGS. 16 and 17).

Practically-rectangular notches 5e are formed on the base surface portion 5, for example, and by the notches 5e, inners portions thereof are formed as practically-triangular processing portions 10C (see FIG. 16). The processing portions 10C are continuous with other portions of the base surface portion 5 via the continuous portions 5b. The continuous portions 5b are provided apart from one another in the circumferential direction. Therefore, the notches 5e are each formed in a shape including the continuous portion 5b.

On the base surface portion 5, the screw clamp portion 11 is provided at a center portion of the continuous portions 5b.

The processing portions 10C are erected 90 degrees in a direction in which the processing portions 10C approach one another and bent in an arc shape to thus form a practically-cylindrical attachment portion 6C (see FIG. 17). Both end edges of tip end edges of the processing portion 10C in the circumferential direction are close to or in contact with the both end edges of other processing portions 10C. It should be noted that the attachment portion 6C does not need to be practically-cylindrical, and a gap may be formed between both end edges of the arcs in the circumferential direction.

In the state where the attachment portion 6C is formed, the screw clamp portion 11 is positioned on an inner side of the attachment portion 6C at a center portion of the attachment portion 6C, for example.

Since the attachment portion 6C is formed by bending the processing portions 10C provided at a plurality of portions on the base surface portion 5 as described above, the degree of freedom in setting the shape and size of the processing portions 10C is high, and thus the degree of freedom in designing the attachment portion 6C can be improved.

Moreover, since the attachment portion 6C is practically cylindrical, the shape of the attachment portion 6C is simple, and thus the attachment portion 6C can be formed with a reduced production cost and a simple structure.

It should be noted that although the descriptions above are given on the example where the processing portions 6B and 6C are respectively formed by two processing portions 10B and four processing portions 10C according to Modified Examples 2 and 3, the number of processing portions is arbitrary, and the attachment portion may be formed by three processing portions or five or more processing portions.

Modified Example 4

Figure 18:
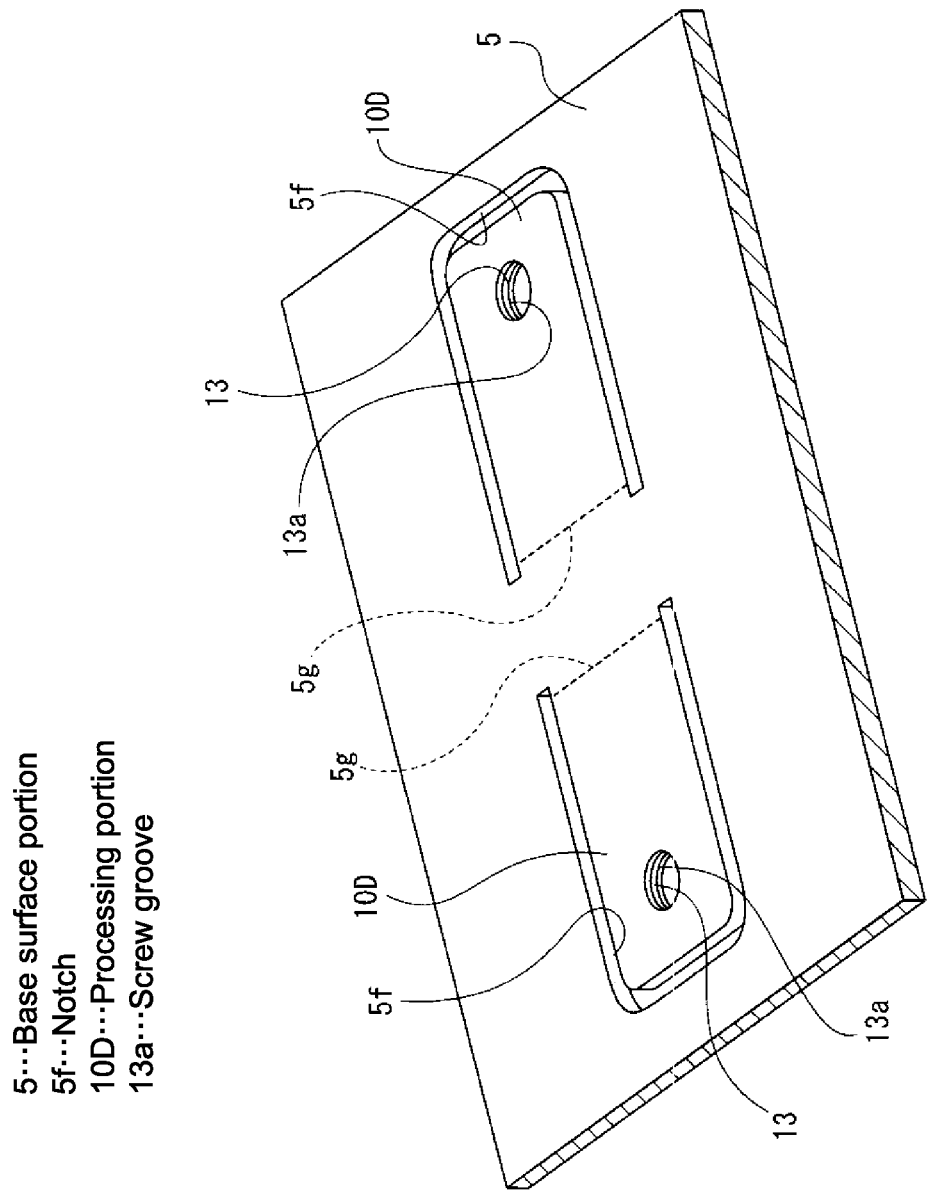
FIG. 18 is an enlarged perspective view showing a state before an attachment portion according to Modified Example 4 is formed.
Figure 19:
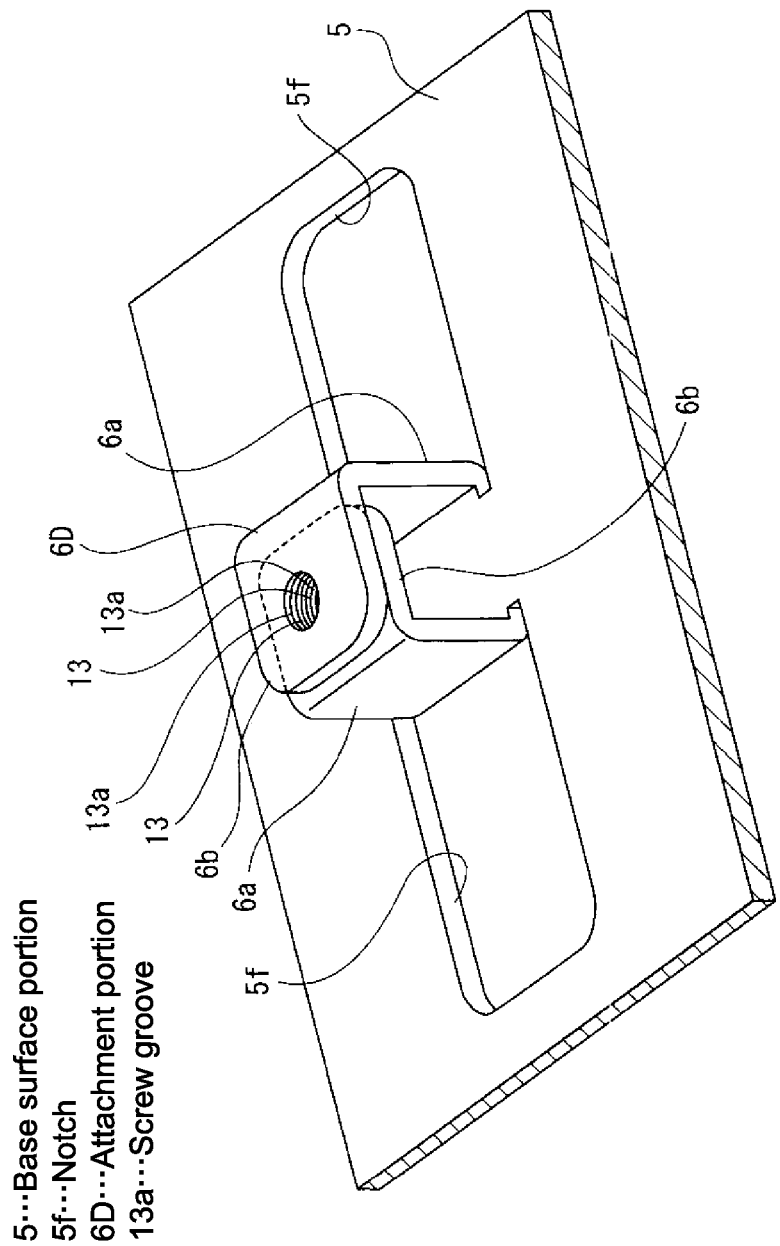
FIG. 19 is an enlarged perspective view showing a state where the attachment portion according to Modified Example 4 is formed.

An attachment portion 6D according to Modified Example 4 is formed by cutting and erecting two parts of the base surface portion 5 of the back chassis 4 (see FIGS. 18 and 19).

Notches 5*f* formed in a square U shape are formed on the base surface portion 5, for example, and by the notches 5*f*, inners portions thereof are formed as rectangular processing portions 10D (see FIG. 18). The processing portions 10D are continuous with other portions of the base surface portion 5 via continuous portions 5*g*.

A screw hole 13 is formed at a tip end portion of each of the processing portions 10D, and a screw groove 13*a* is formed on a circumferential surface of each of the screw holes 13.

The processing portions 10D are erected 90 degrees in a direction in which the processing portions 10D approach each other, a half portion of each of the processing portions 10D on the tip end side is additionally bent 90 degrees on the erected side, and the half portions of the processing portions 10D are superimposed, to thus form the attachment portion 6D (see FIG. 19). The attachment portion 6D is constituted of erected portions 6*a* erected vertically from the base surface portion 5 and superimposed portions 6*b* superimposed while being parallel to the base surface portion 5.

The screw holes 13 are formed on the superimposed portions 6*b*, and center axes of the screw holes 13 match. The screw shaft portion 100*a* is screwed to the screw grooves 13*a* of the screw holes 13 when an attachment is made using the attachment screw 100.

Since the attachment portion 6D includes the superimposed portions 6*b* formed by superimposing the parts of the processing portions 10D as described above, the thickness is large, and thus a high rigidity can be secured that much.

Moreover, since the screw holes 13 including the screw grooves 13*a* are formed on the superimposed portions 6*b*, the screwing portion of the screw shaft portion 100*a* of the attachment screw 100 becomes large, and thus the attachment state by the attachment screw 100 can be stabilized.

Furthermore, since the screwing portion of the screw shaft portion 100*a* can be enlarged without performing burring processing, the production cost can be reduced as the burring processing is unnecessary.

It should be noted that although the descriptions above are given on the example where the screw holes 13 are formed in the attachment portion 6D, it is also possible to form the screw clamp portion 11 between the continuous portions 5*g* on the base surface portion 5 and screw the screw shaft portion 100*a* of the attachment screw 100 to the screw clamp portion 11, for example. In this case, it is also possible to form the screw holes 13 of the attachment portion 6D as screw insertion holes in which the screw grooves 13*a* are not formed.

Modified Example 5

Figure 20:
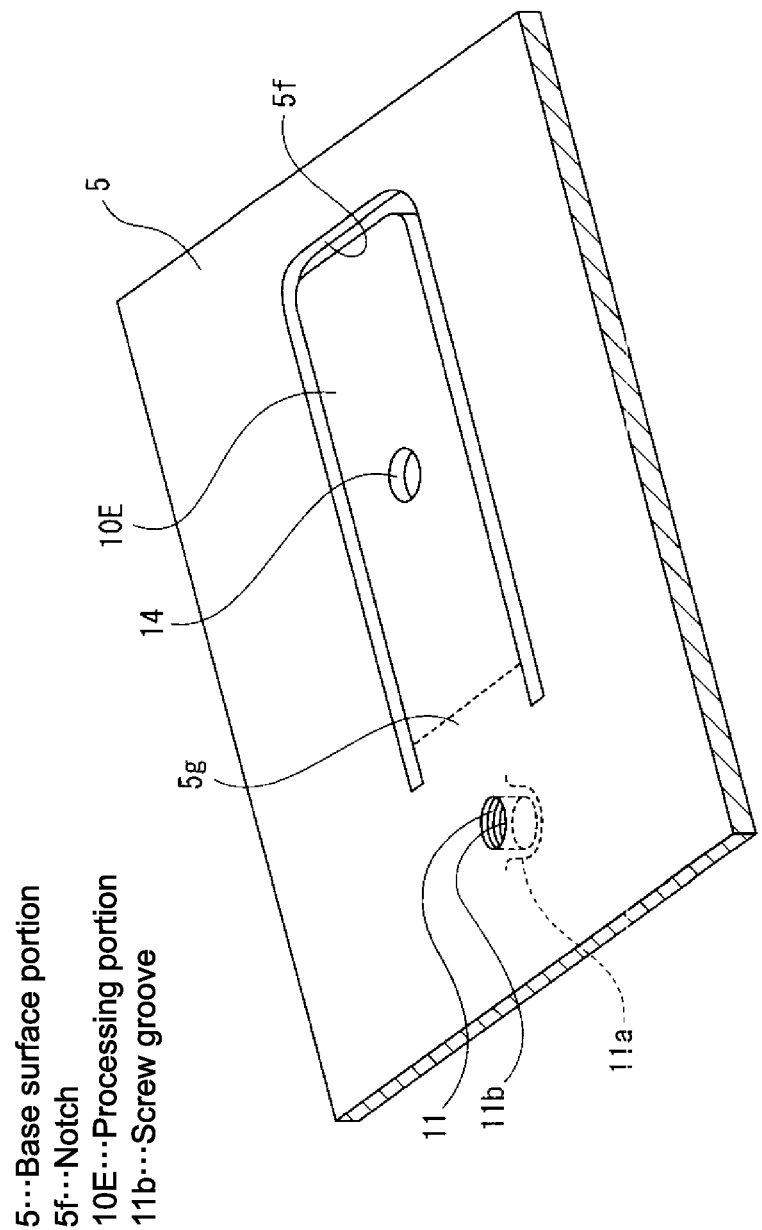
FIG. 20 is an enlarged perspective view showing a state before an attachment portion according to Modified Example 5 is formed.
Figure 21:
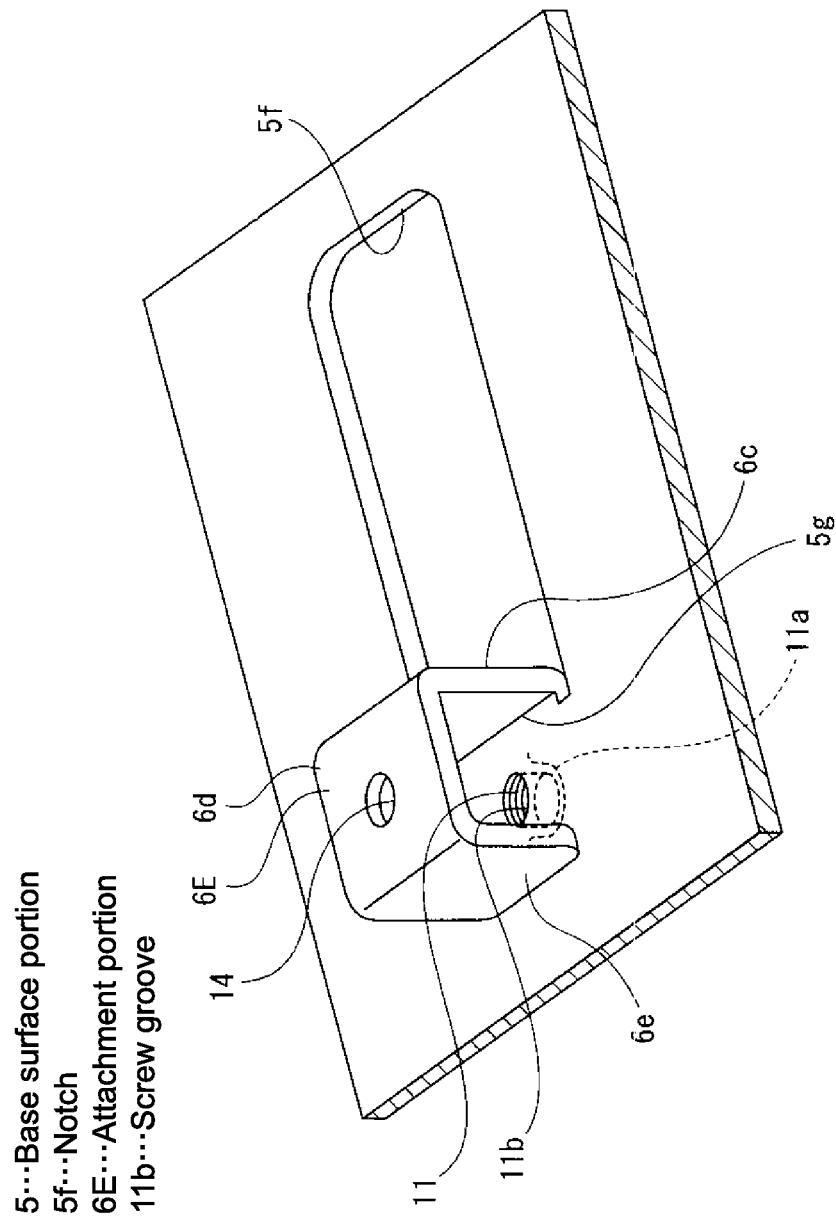
FIG. 21 is an enlarged perspective view showing a state where the attachment portion according to Modified Example 5 is formed.

An attachment portion 6E according to Modified Example 5 is formed by cutting and erecting a part of the base surface portion 5 of the back chassis 4 (see FIGS. 20 and 21).

The notch 5*f* formed in a square U shape is formed on the base surface portion 5, for example, and by the notch 5*f*, an inner portion thereof is formed as a rectangular processing portion 10E elongated in one direction (see FIG. 20). The processing portion 10E is continuous with other portions of the base surface portion 5 via the continuous portion 5*g*.

The screw clamp portion 11 is provided in the vicinity of the continuous portion 5*g* on the base surface portion 5.

A screw insertion hole 14 is formed at a center portion of the processing portion 10E in the longitudinal direction.

The processing portion 10E is erected 90 degrees, about ⅔ of the processing portion 10E on a tip end side is additionally bent 90 degrees on the erected side, and about ⅓ of the processing portion 10E on the tip end side is additionally bent 90 degrees on the erected side, to thus form the attachment portion 6E (see FIG. 21). The attachment portion 6E is constituted of an erected portion 6*c* erected vertically from the base surface portion 5, an intermediate portion 6*d* parallel to the base surface portion 5, and a tip end portion 6*e* opposing the erected portion 6*c*.

The screw insertion hole 14 is formed on the intermediate portion 6*d*, and an axial center of the screw insertion hole 14 matches that of the screw clamp portion 11.

The screw shaft portion 100*a* of the attachment screw 100 is inserted into the screw insertion hole 14, and the screw shaft portion 100*a* is screwed to the screw clamp portion 11.

Since the attachment portion 6E is formed by bending the part of the processing portion 10E a plurality of times as described above, the attachment portion 6E can be formed with ease.

It should be noted that although the descriptions above are given on the example where the screw insertion hole 14 is formed in the attachment portion 6E, it is also possible to form a screw hole to which the screw shaft portion 100*a* of the attachment screw 100 is screwed in place of the screw insertion hole 14, for example. In this case, it is also possible to adopt a structure in which the screw clamp portion 11 is not formed.

Modified Example 6

Figure 22:
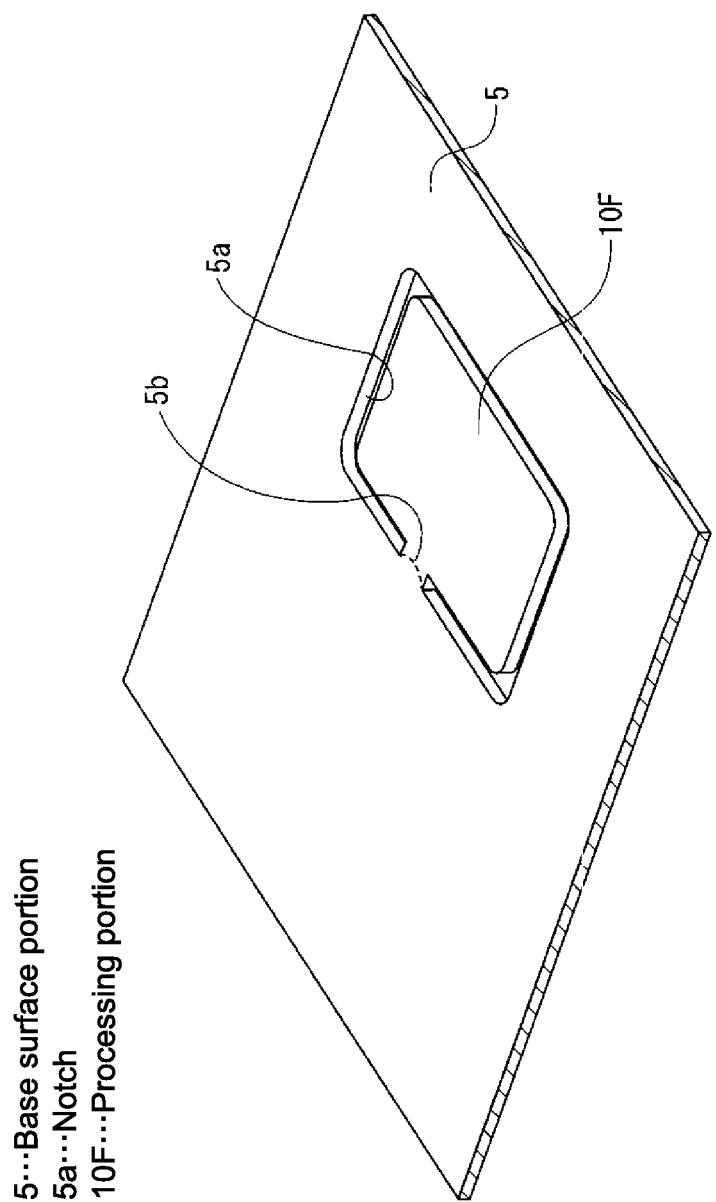
FIG. 22 is an enlarged perspective view showing a state before an attachment portion according to Modified Example 6 is formed.
Figure 23:
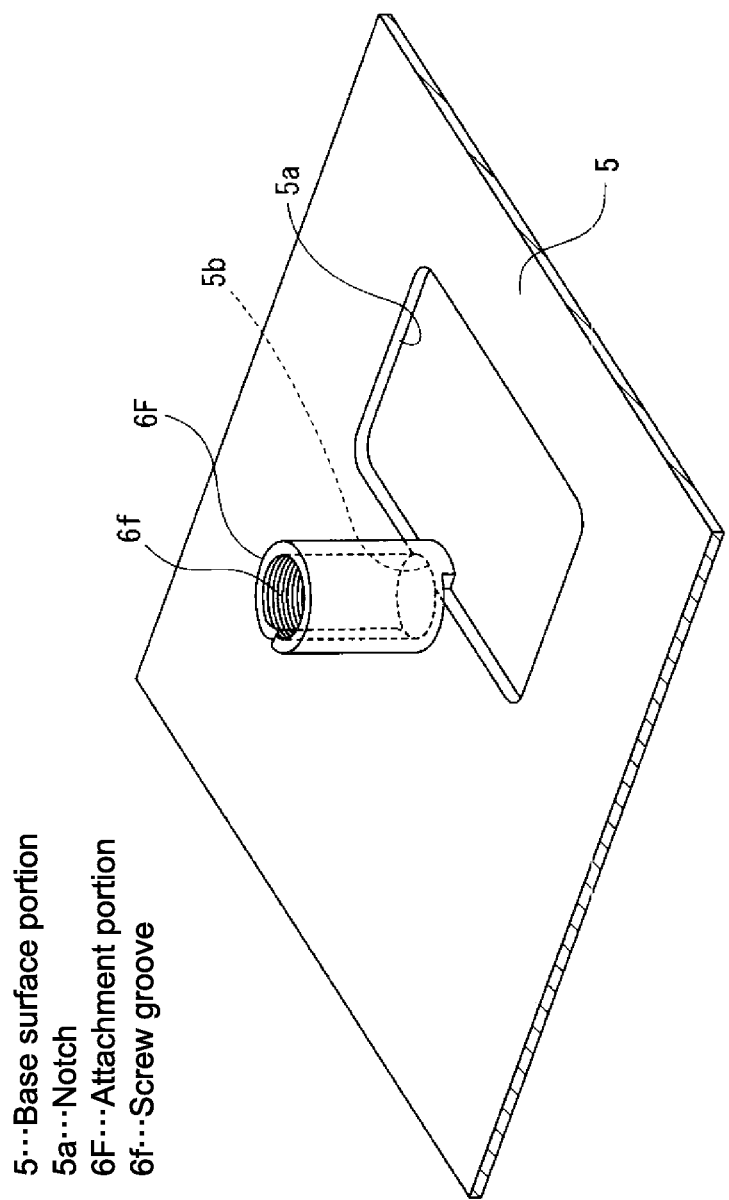
FIG. 23 is an enlarged perspective view showing a state where the attachment portion according to Modified Example 6 is formed.

An attachment portion 6F according to Modified Example 6 is formed by cutting and erecting a part of the base surface portion 5 of the back chassis 4 (see FIGS. 22 and 23).

The practically-rectangular notch 5*a* is formed on the base surface portion 5, for example, and by the notch 5*a*, an inner portion thereof is formed as a horizontally-long rectangular processing portion 10F (see FIG. 22). The processing portion 10F is continuous with other portions of the base surface portion 5 via the continuous portion 5*b*. Therefore, the notch 5*a* is formed in a shape including the continuous portion 5*b*.

The processing portion 10F is erected 90 degrees and bent so as to form the cylindrical attachment portion 6F (see FIG. 23). Both end edges of the attachment portion 6F in the circumferential direction are close to or in contact with each other. It should be noted that the attachment portion 6F does not need to be cylindrical, and a gap may be formed between both end edges of an arc-shaped attachment portion 6F in the circumferential direction.

A screw groove 6*f* is formed on an inner circumferential surface of the attachment portion 6F.

When attached, the screw shaft portion 100*a* of the attachment screw 100 is screwed to the screw groove 6*f* of the attachment portion 6F.

By forming the screw groove 6*f* on the inner circumferential surface of the attachment portion 6F as described above, the screwing portion of the screw shaft portion 100*a* of the attachment screw 100 becomes large, and the attachment state using the attachment screw 100 can be stabilized.

Moreover, since the screwing portion of the screw shaft portion 100*a* can be enlarged without performing the burring processing, the production cost can be reduced as the burring processing is unnecessary.

<Others>

In the attachment portion 6F according to Modified Example 6, when the screw shaft portion 100a of the attachment screw 100 is screwed to the screw groove 6f, a force of opening the entire attachment portion 6F toward an outer side is generated. As a result, there is a fear that the stable screwed state of the screw shaft portion 100a with respect to the screw groove 6f may be impaired.

Figure 24:
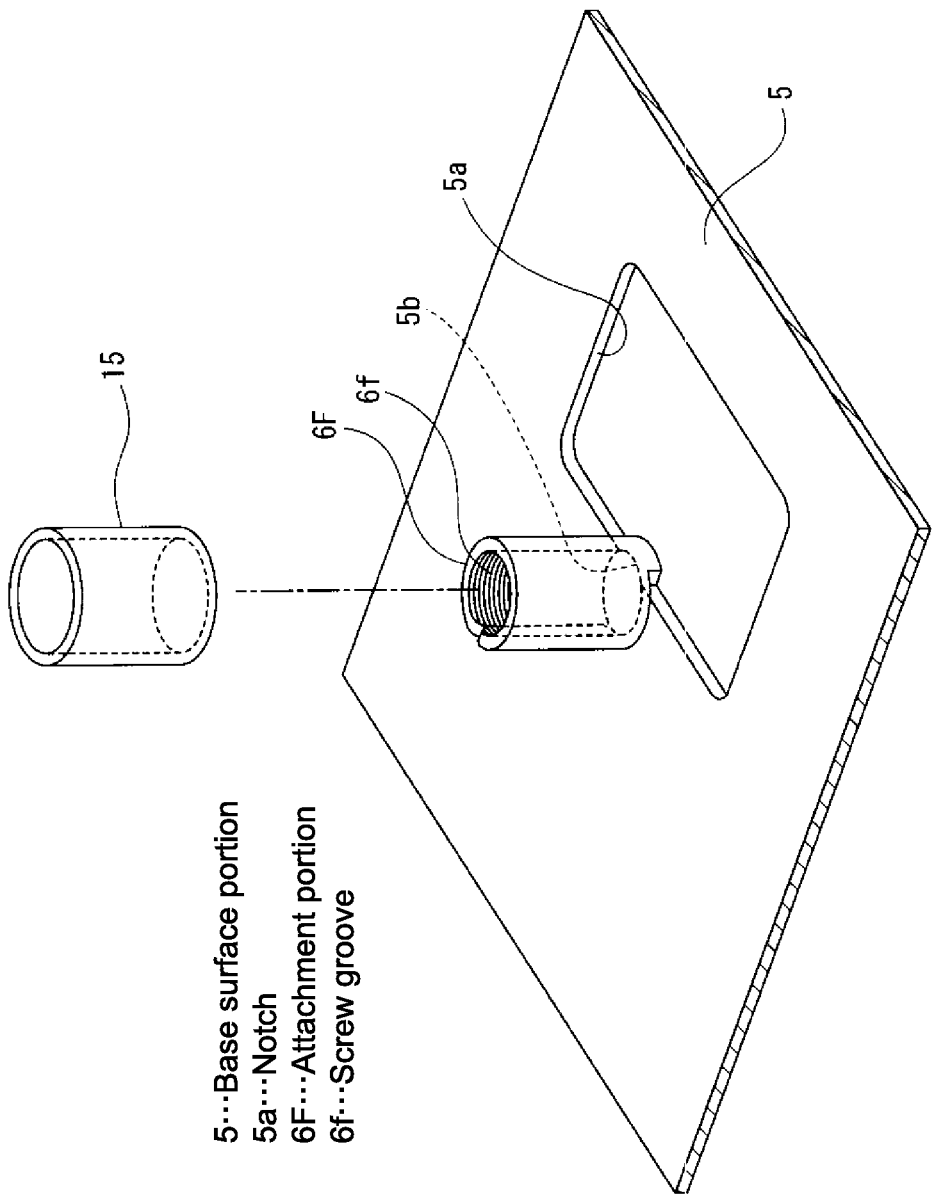
FIG. 24 is an enlarged perspective view showing a state before a cylindrical member is fit in the attachment portion according to Modified Example 6.
Figure 25:
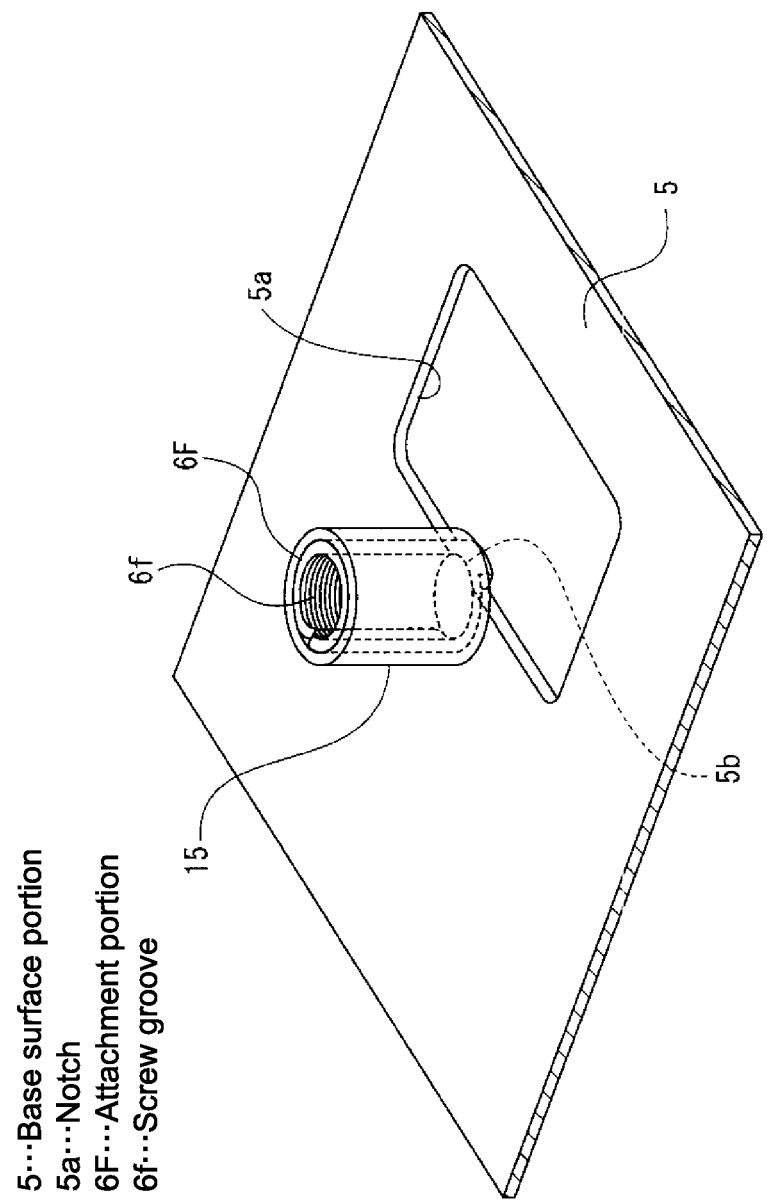
FIG. 25 is an enlarged perspective view showing a state where the cylindrical member is fit in the attachment portion according to Modified Example 6.

In this regard, by attaching a cylindrical member 15 to the attachment portion 6F like a cover as shown in FIGS. 24 and 25, the attachment portion 6F can be prevented from opening, and a stable screwed state of the screw shaft portion 100a with respect to the screw groove 6f can be secured.

It should be noted that the cylindrical member 15 may also be used in the attachment portions 6, 6A, 6B, and 6C, for example.

Furthermore, as means for preventing the attachment portion from opening, it is also possible to adopt a structure in which the concave and convex portions are fitted with one another as shown in FIG. 11 or a structure in which at least parts of both end portions of a cylindrical attachment portion in the circumferential direction are bonded by adhesion, welding, or the like, for example.

<Summary>

As described above, in the display apparatus 1, the attachment portions 6, 6A, 6B, 6C, 6D, 6E, and 6F are formed by cutting and erecting a part (parts) of the plate-like base surface portion 5 and bending it (them) in a predetermined shape.

Therefore, since the drawing processing is unnecessary in forming the attachment portions 6, 6A, 6B, 6C, 6D, 6E, and 6F, the heights are not limited, and no tilted portion is formed, the degree of freedom in design can be improved.

Furthermore, since the attachment portions 6, 6A, 6B, 6C, 6D, 6E, and 6F are formed integrally with the base surface portion 5, the production cost can be reduced.

PRESENT DISCLOSURE

The present disclosure may also take the following structures:

(1) An attachment structure, including
an attachment portion formed by cutting and erecting a processing portion provided as an inner portion of a notch formed on a plate-like base surface portion and bending the processing portion in a predetermined shape,
one of an inner portion of the attachment portion on the base surface portion and the attachment portion having a screw groove to which an attachment screw is to be screwed formed therein.

(2) The attachment structure according to (1) above, in which the attachment portion is cylindrical.

(3) The attachment structure according to (2) above, in which the screw groove is formed on an inner circumferential surface of the attachment portion.

(4) The attachment structure according to any one of (1) to (3) above,
in which the base surface portion includes a reinforcement portion that reinforces the attachment portion, the reinforcement portion being formed by cutting and erecting a part of the base surface portion and bonding it to the attachment portion.

(5) The attachment structure according to any one of (1) to (4) above,
in which the processing portion is provided at a plurality of portions of the base surface portion, and
in which the attachment portion is formed by bending the plurality of processing portions.

(6) The attachment structure according to (5) above, in which a part of each of the plurality of processing portions is superimposed in a thickness direction.

(7) The attachment structure according to (6) above,
in which the screw groove is formed at a portion where the part of each of the plurality of processing portions is superimposed.

(8) The attachment structure according to any one of (1) to (7) above,
in which the attachment portion can be elastically deformed in an axial direction of the attachment screw with respect to the screw groove.

(9) The attachment structure according to any one of (1) to (8) above,
in which the attachment portion includes a concave portion and a convex portion at both end portions thereof in a circumferential direction, the concave portion and the convex portion at the both end portions fitting with each other.

(10) A display apparatus, including:
a display on which an image is displayed; and
a back chassis including a plate-like base surface portion,
the base surface portion including an attachment portion formed by cutting and erecting a processing portion provided as an inner portion of a notch formed on the base surface portion and bending the processing portion in a predetermined shape,
one of an inner portion of the attachment portion on the base surface portion and the attachment portion having a screw groove to which an attachment screw is to be screwed formed therein.

The present disclosure contains subject matter related to that disclosed in Japanese Priority Patent Application JP 2012-219509 filed in the Japan Patent Office on Oct. 1, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An attachment structure, comprising
an attachment portion formed by cutting and erecting a processing portion provided as an inner portion of a notch formed on a plate-like base surface portion and bending the processing portion in a predetermined shape,
one of an inner portion of the attachment portion on the base surface portion and the attachment portion having a screw groove to which an attachment screw is to be screwed formed therein.

2. The attachment structure according to claim 1, wherein the attachment portion is cylindrical.

3. The attachment structure according to claim 2, wherein the screw groove is formed on an inner circumferential surface of the attachment portion.

4. The attachment structure according to claim 1,
wherein the base surface portion includes a reinforcement portion that reinforces the attachment portion, the reinforcement portion being formed by cutting and erecting a part of the base surface portion and bonding it to the attachment portion.

5. The attachment structure according to claim 1,
wherein the processing portion is provided at a plurality of portions of the base surface portion, and
wherein the attachment portion is formed by bending the plurality of processing portions.

6. The attachment structure according to claim 5,
wherein a part of each of the plurality of processing portions is superimposed in a thickness direction.

7. The attachment structure according to claim 6,
wherein the screw groove is formed at a portion where the part of each of the plurality of processing portions is superimposed.

8. The attachment structure according to claim 1,
wherein the attachment portion can be elastically deformed in an axial direction of the attachment screw with respect to the screw groove.

9. The attachment structure according to claim 1,
wherein the attachment portion includes a concave portion and a convex portion at both end portions thereof in a circumferential direction, the concave portion and the convex portion at the both end portions fitting with each other.

10. A display apparatus, comprising:
a display on which an image is displayed; and
a back chassis including a plate-like base surface portion, the base surface portion including an attachment portion formed by cutting and erecting a processing portion provided as an inner portion of a notch formed on the base surface portion and bending the processing portion in a predetermined shape,
one of an inner portion of the attachment portion on the base surface portion and the attachment portion having a screw groove to which an attachment screw is to be screwed formed therein.

\* \* \* \* \*